United States Patent [19]

Cantwell

[11] Patent Number: 4,680,588
[45] Date of Patent: Jul. 14, 1987

[54] RADAR SYSTEM WITH INCREMENTAL AUTOMATIC GAIN CONTROL

[75] Inventor: Robert H. Cantwell, Sudbury, Mass.

[73] Assignee: Raytheon Company, Lexington, Mass.

[21] Appl. No.: 804,944

[22] Filed: Dec. 5, 1985

[51] Int. Cl.⁴ ............................................. G01S 7/34
[52] U.S. Cl. ....................................... 342/92; 342/26
[58] Field of Search ............. 343/7 AG, 7 A; 367/98; 342/91, 92

[56] References Cited

U.S. PATENT DOCUMENTS

| | | | |
|---|---|---|---|
| 3,719,942 | 3/1973 | Herman et al. | 343/7 A |
| 3,781,882 | 12/1973 | Holberg | 343/7 A |
| 3,786,506 | 1/1974 | Effinger et al. | 343/7 AG |
| 3,944,942 | 3/1976 | Chudleigh | 343/7 AG X |
| 4,058,809 | 11/1977 | Chudleigh | 343/7 AG X |
| 4,062,011 | 12/1977 | Preston et al. | 343/7 A |
| 4,144,533 | 3/1979 | Van Hijfte et al. | 343/7 AG |
| 4,233,604 | 11/1980 | Lepere | 343/7 AG |

Primary Examiner—T. H. Tubbesing
Assistant Examiner—Mark Hellner
Attorney, Agent, or Firm—Walter F. Dawson; Richard M. Sharkansky

[57] ABSTRACT

A radar receiver having a feed-forward control circuit for adjusting the automatic gain control (AGC) setting in 6 dB increments for each range cell in a next sweep based on the AGC setting of each corresponding range cell in the present sweep, the magnitude of the larger of the in-phase (I) or quadrature (Q) components of the video signals of the present sweep from an A/D converter, the status of present sweep and previous sweep A/D limit conditions, and a selected guardband thereby holding the level of the radar return signal within the dynamic range of the A/D converter. The AGC setting is adjusted using a switchable attenuator which changes the level of the video signal into the A/D converter in 6 dB increments, each increment corresponding to a common I and Q data exponent directly used for floating point signal processing. A pulse interference detection and signal replacement apparatus and method utilizes an 8-bit log magnitude representation of each range cell sample generated from a floating point exponent and reduced precision mantissa components to detect a range cell pulse of interference at a specific range M and causes replacement of the range cell sample with an interpolated value determined from the average of the radar return signals of adjacent sweeps at range M.

28 Claims, 10 Drawing Figures

RADAR SYSTEM WITH INCREMENTAL AUTOMATIC GAIN CONTROL

BACKGROUND OF THE INVENTION

This invention relates generally to radar signal processing and in particular to an apparatus and method for processing radar return data for a weather radar system.

Pulsed doppler radars that are required to process radar return signals with a large dynamic range such as in weather radar applications often use a feed-forward closed-loop automatic gain control (AGC) to maintain the amplitude of the input signals within the dynamic range of the radar's receiver and in particular within the dynamic range of the receiver's analog to digital (A/D) converter(s). The AGC may be controlled by analog control before the A/D converter or by digital control after the A/D converter. The radar return signals typically are integrated in a sliding window, block averager or exponential integrator by analog or digital means in order to adjust a linear automatic gain controlled amplifier or attenuator. An AGC signal in multiples or submultiples of a decibel (dB) is fed forward, scaled and added to a logarithm of the fixed point A/D data to produce the logarithm of the radar return signals. Radar jamming and pulse interference from other radars result in limiting in the receiver's A/D converter and generally control the AGC signal thereby reducing the radar's dynamic range and ability to suppress ground clutter.

Another known approach in the art is to delay the radar return signals until the magnitude, power or log of the return signals set the gain of a linear amplifier or attenuator which results in the delayed return signals being within the dynamic range of the A/D converter(s) in the radar receiver. However, analog and video delays are difficult and expensive to control accurately over a power supply tolerance and operating temperature range for the processing required to control the gain of the linear amplifier or attenuator.

Pulse interference detectors are employed in radar systems to eliminate the processing of random impulse type interferences. One known approach in the prior art examines range cells adjacent to range cell M, i.e. M−1 and M+1, while processing a range M return signal to detect a pulse interference but does not generate replacement data for an interfered-with pulse at range M.

Another approach known as coincidence technique for random pulse interference uses a sweep to sweep coincidence criteria which requires an amplitude threshold to be exceeded on two (or more) successive sweeps at the same range before a radar return is accepted as a valid signal. However this approach causes a loss in detection sensitivity because successive sweeps of weak signals may not reach the required amplitude threshold.

Another approach known in the prior art as an amplitude difference interference rejector uses a sweep to sweep amplitude comparison for each range cell. A random interference return with a large amplitude has a low probability of occurring in adjacent sweeps at the same range. By comparing the amplitude difference between the present sweep and previous sweep, random pulse interference can be rejected without appreciably affecting strong valid radar returns which are correlated within the antenna beamwidth. However, in a typical coherent radar system when a pulse interference is detected, eight to ten radar return signals being processed end up being lost along with the radar return for the range cell tested.

SUMMARY OF THE INVENTION

In accordance with the present invention a receiver is provided having a variable dynamic range for processing input signals from a plurality of transmission sweeps, each of the sweeps having a plurality of range cells. The variable dynamic range results from incrementally attenuating range sample input signals in 6 dB increments in order to measure video signal representations of each of the input signals' amplitudes within the dynamic range of analog to digital (A/D) converters. The amount of incremental attenuation is selected by an AGC level signal which is determined for each one of the range cells in a next transmission sweep based on examining the AGC level for a corresponding one of the range cells in a present sweep, an A/D limit condition for a corresponding range cell in a previous sweep, an absolute value of one of the video signal representations in the present sweep and an A/D limit condition set by the absolute value. In addition the amount of incremental attenuation is based on whether a 6 dB guardband is selected for high pulse repetition frequency waveforms or a 12 dB guardband for low pulse repetition frequency waveforms. A digital signal processor is coupled to the receiver for processing the video signal representations produced by the A/D converters in normalized floating point number notation wherein the incremental AGC level generated for measuring a particular range sample becomes the exponent value (or a portion thereof) of the normalized floating point number. This approach results in very efficient signal processing.

In accordance with a further feature of the invention a method is provided for performing incremental automatic gain control (AGC) in a radar receiver operating on radar return signals from a plurality of radar sweeps each of the sweeps having a plurality of range cells comprising the steps of incrementally adjusting a dynamic range of the receiver to correspond to a range of possible amplitudes of the radar return signals in response to a next sweep AGC level, determining from in-phase and quadrature components of the radar return signals the next sweep AGC level for each of the range cells in the next sweep based on an AGC level for a corresponding one of said range cells in a present one of said sweeps, a present sweep A/D limit condition, and a previous sweep A/D limit condition; in addition further steps include storing in a memory each of the next sweep AGC levels and the present sweep A/D limit conditions, temporarily storing output data from the memory in a register wherein the output data comprises the present sweep AGC level and the previous sweep A/D limit condition, and delaying output data from the register to enable such data comprising the present sweep AGC level to become coincident in time with the in-phase and quadrature components derived from the return signal attenuated by the present sweep AGC level. The step of determining the next sweep AGC level for each of the range cells in the next sweep further comprises the steps of generating a mantissa and an exponent for each of the in-phase and quadrature components, selecting a largest exponent of the in-phase and quadrature components, and generating the next sweep AGC level as determined by a selected A/D level guardband, the largest exponent, the present sweep AGC level, the present sweep A/D limit and the previous sweep A/D limit for corresponding range cells.

In accordance with the present invention a radar system is provided wherein radar return or received signals are processed in a receiver and a digital signal processor comprising means for providing pulse interference detection. The pulse interference detection apparatus comprises means for converting a fixed point data representation of an in-phase (I) and a quadrature (Q) components for each of the received signals to a floating point data representation having a mantissa and an exponent, the mantissa having at least one most significant bit for increased precision, means coupled to the converting means and in response to an AGC level word for generating a log magnitude value for each of the received signals, and means coupled to the log magnitude generating means for detecting a pulse of interference to one of the received signals in a sweep $N-1$ at range M based on an examination of the log magnitude value of adjacent sweeps N and $N-2$ at range M.

The log magnitude value is primarily determined by the largest exponent of the in-phase (I) and quadrature (Q) components for each of the received signals. More precision is achieved by generating a log magnitude mantissa correction value in response to a normalized mantissa of each of the in-phase (I) and quadrature (Q) components and a denormalizing control word. This mantissa correction value is aligned for proper scaling and added to such largest exponent producing an A/D output log magnitude value. The AGC level used to attenuate the return signal is then added to the A/D output log magnitude producing a log magnitude for the actual radar return signal.

In accordance with a further feature of the invention a pulse interference detector comprises means for storing log magnitude values $Y_2$, X and $Y_1$ for the adjacent range sweeps N, $N-1$ and $N-2$ respectively, means coupled to the storing means of the $Y_1$ and $Y_2$ values for generating an average value of the $Y_1$ and $Y_2$ log magnitudes values, means for adding the average value to a threshold level forming a sum, and means coupled to the adding means for comparing the sum of the average value and the threshold level to the X value wherein a pulse interference signal is generated when the X value is greater than the sum.

In accordance with a further feature of the invention for detecting and replacing a pulse of interference in a radar system wherein received signals are processed having amplitudes which may vary within a wide range of possible amplitudes using automatic gain control, the apparatus comprises means for converting a fixed point data representation of an in-phase (I) and a quadrature (Q) components for each of the received signals to a first floating point data representation having a mantissa and an exponent, the mantissa having at least one most significant bit for increased precision, means coupled to the converting means and in response to an AGC level word for generating a log magnitude value for each of the receive signals, means coupled to the log magnitude generating means for detecting a pulse of interference to one of the received signals in a sweep $N-1$ at range M based on an examination of the log magnitude value of adjacent sweeps N and $N-2$ at range M and generating a pulse interference detection signal when the pulse of interference is detected, means for generating a second normalized floating point data representation of the received signals in response to the fixed point data representation for each of the amplitudes of the received signals and the AGC level word, and floating point interpolator means coupled to both the second floating point data generating means and the interference detecting means for producing interpolated data to replace the pulse of interference for one of the received signals at range M of sweep $N-1$ in response to the pulse interference detection signal.

A further feature of the invention includes a method of detecting and replacing a pulse of interference comprising the steps of converting a fixed point data representation of an in-phase (I) and a quadrature (Q) components for each of the received signals to a first normalized floating point representation having a mantissa and an exponent, the mantissa having at least one most significant bit for increased precision, generating a log magnitude value for each of the received signals in response to the normalized floating point data representation and an AGC level word, detecting a pulse of interference to one of the received signals in a sweep $N-1$ at range M based on an examination of the log magnitude value of adjacent sweeps N and $N-2$ at range M, generating a pulse interference detection signal when the pulse of interference is detected, generating a second normalized floating point data representation of the received signals in response to the fixed point data representation for each of the amplitudes of the received signals and the AGC level word, and producing interpolated data from the second normalized floating point data representation of the received signals to replace the pulse of interference for one of the received signals at range M of sweep $N-1$ in response to the pulse interference detection signals. The step of generating a log magnitude value further comprises the steps of generating a log magnitude mantissa correction value in response to the normalized mantissa of each of the in-phase (I) and quadrature (Q) components for each of the received signals and a denormalizing control word, adding the log magnitude mantissa correction value to a largest exponent of the in-phase (I) and quadrature (Q) components for each of the received signals producing an A/D output log magnitude, and adding the A/D output log magnitude to the AGC level word to obtain the log magnitude value for each of the received signals wherein the AGC level word represents an attenuator factor applied to each of the received signals to keep these signals within the A/D converter dynamic range.

In accordance with a further feature of the invention, the method of detecting a pulse of interference in a radar system comprising the steps of storing log magnitude values $Y_2$, X and $Y_1$ for adjacent range sweeps N, N−1 and N−2, generating an average value of the $Y_1$ and $Y_2$ log magnitude values, adding the average value to a threshold level forming a sum, comparing the sum of the average value of the threshold level to the X value, and generating a pulse interference signal when the X value is greater than the sum.

BRIEF DESCRIPTION OF THE DRAWINGS

Other and further features and advantages of the invention will become apparent in connection with the accompanying drawings wherein.

DESCRIPTION OF THE PREFERRED EMBODIMENT

Figure 1:
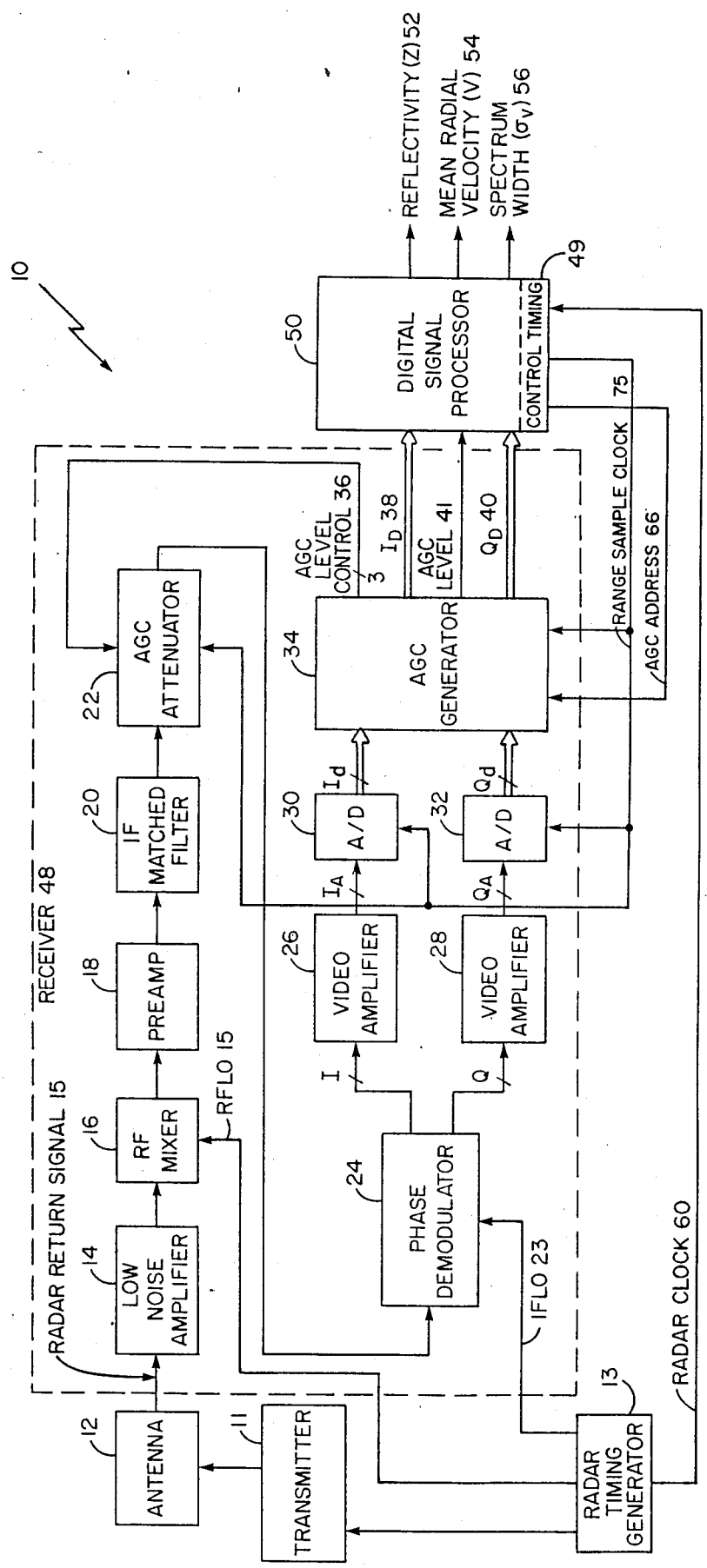
FIG. 1 illustrates a weather radar receiver embodying the invention coupled to a digital signal processor.

A weather radar receiver and digital signal processor system 10 operable in accordance with the present invention are illustrated in FIG. 1. A plurality of radar signals are generated by transmitter 11 and transmitted by antenna 12 during a plurality of radar sweeps, each of the sweeps comprising a plurality of range cells. The pulse repetition interval (PRI) is the time between adjacent transmitted radar signals and this interval is also referred to as a sweep in range. A receiver 48 accepts radar return signals 15 from the antenna 12 and down converts them to in-phase (I) and quadrature (Q) video signals. Analog to digital (A/D) converters 30, 32 convert the video signals to 12-bit digital word representations and an automatic gain control (AGC) generator 34 provides a 3-bit AGC level control binary word 36 to an AGC attenuator 22 in order to provide the receiver 48 with a variable dynamic range capability by attenuating the radar return signals 15 in seven 6 dB increments as required to remain within the dynamic range of the A/D converters 30, 32. A digital signal processor 50 receives the digital representations of the video signal data from the receiver 48 and performs the processing required to develop radar base data comprising estimates of reflectivity (Z), mean radial velocity (V) and spectrum width ($\sigma_v$). In addition, digital signal processor 50 provides for pulse interference detection to eliminate or substantially reduce processing errors due to random pulse interference.

INCREMENTAL AUTOMATIC GAIN CONTROL

Still referring to FIG. 1, the radar return signals 15 (S-band) are amplified by a low noise amplifier 14 and the signals are coupled to an RF mixer 16 having an RF local oscillator input (RFLO 15) from a radar timing generator 13 for converting the radar return signals 15 to 30 Mhz intermediate frequency (IF) signals. The radar timing generator 13 provides a 10 MHz radar clock 60 signal for radar system timing. The IF signals are amplified by a preamplifier 18 and coupled to an IF matched filter 20 for optimizing the signal to noise IF of the radar return signals 15 by matching the bandwidth of the matched filter 20 to the information bandwidth of the radar return signals 15. The output from the IF matched filter 20 is coupled to the AGC attenuator 22 which provides seven (7) levels of attenuation in 6 dB increments in addition to zero attenuation in response to the 3-bit AGC level control word 36 so that the $I_A$ and $Q_A$ signals are kept within the dynamic range of the analog to digital (A/D) converters 30, 32 effectively extending the system dynamic range capability. The AGC attenuator 22 comprises −6 dB, −12 dB and −24 dB attenuating sections, each section being under the control of one of the three bits of the AGC level control word 36 such that any combination of attenuation in 6 dB increments up to 42 dB can be selected to provide the extended dynamic range. The output of the AGC attenuator 22 is coupled to a phase demodulator 24 having IF local oscillator input (IFLO 23) from the radar timing generator 13 for generating the I and Q video signal representations of the radar return signals 15. The phase demodulator 24 divides the IF representation of radar return signals 15 into the in-phase (I) and quadrature (Q) components for each range cell sample. Video amplifiers 26 and 28 amplify the I and Q signals respectively producing $I_A$ and $Q_A$. Two 12-bit A/D converters 30, 32 in response to a range sample clock 75 derived from the radar clock 60 sample analog signals, $I_A$ and $Q_A$, and produce two's complement 12-bit digital number representations $I_d$ and $Q_d$ respectively as shown in Table 1 for each analog signal. In the preferred embodiment the range sample clock 75 is an integral number of radar clock 60 counts and it is used for a continuous A/D sampling rate to eliminate transients that result from an interrupted sampling rate.

The 12-bit $I_d$ and 12-bit $Q_d$ radar return data is coupled to an automatic gain control (AGC) generator 34 which generates the 3-bit AGC level control word 36 for selecting the setting of the AGC attenuator 22 in 6 dB increments.

TABLE 1

| $I_d$ or $Q_d$ A/D Levels Decimal | $I_d$ OR $Q_d$ DATA FORMAT Binary (2's Complement) Data Format | | | | | | | | | | |
|---|---|---|---|---|---|---|---|---|---|---|---|
| | MSB 11 | 10 | 9 | 8 | 7 | 6 | Bit 5 | 4 | 3 | 2 | 1 | LSB 0 |
| Max 2047 | 0 | 1 | 1 | 1 | 1 | 1 | 1 | 1 | 1 | 1 | 1 | 1 |
| ⋮ | | | | | | | | | | | | |
| 1 | 0 | 0 | 0 | 0 | 0 | 0 | 0 | 0 | 0 | 0 | 0 | 1 |
| Zero 0 | 0 | 0 | 0 | 0 | 0 | 0 | 0 | 0 | 0 | 0 | 0 | 0 |
| −1 | 1 | 1 | 1 | 1 | 1 | 1 | 1 | 1 | 1 | 1 | 1 | 1 |
| ⋮ | | | | | | | | | | | | |
| −2047 | 1 | 0 | 0 | 0 | 0 | 0 | 0 | 0 | 0 | 0 | 0 | 1 |
| Min −2048 | 1 | 0 | 0 | 0 | 0 | 0 | 0 | 0 | 0 | 0 | 0 | 0 |

This automatic gain control loop together with the 12-bit A/D converters 30, 32 determines the system dynamic range which in the present preferred embodiment shown in FIG. 1 amounts to 102 dB. The AGC loop comprising the AGC generator 34 and the AGC attenuator 22 provides 42 dB of the total 102 dB in the selectable 6 dB increments. The A/D converters 30, 32 have a dynamic range of 60 dB. The AGC generator 34 determines the AGC attenuator 22 setting for the corresponding range cell in the next PRI. It is derived from the larger of either I or Q absolute values of the range cell, the corresponding AGC setting in the present PRI and A/D limit detection of the present and previous PRI for a specific guardband 97, 99 shown in FIG. 2 and FIG. 3 and described hereinbelow. The fixed point 12-bit $I_d$ and 12-bit $Q_d$ data are held in A/D data register 71 in AGC generator 34 (FIG. 4) for a period of one range sample and this data is fed forward as $I_D$ 38 and $Q_D$ 40 data to the digital signal processor 50 along with a 3-bit AGC level word 41 that was used to obtain that data. The A/D data, $I_D$ 38 and $Q_D$ 40, is now aligned in time with the 3-bit AGC level word 41 for processing full amplitude radar return signals 15 within the total system dynamic range. Then, the digital signal processor 50 performs the processing required to suppress ground clutter and generate the radar base data signals, i.e. reflectivity (Z) 52, mean radial velocity (V) 54, and the spectrum width ($\sigma_v$) 56 and also generates the control timing 49 in response to radar clock 60 for the radar system.

Figure 2:
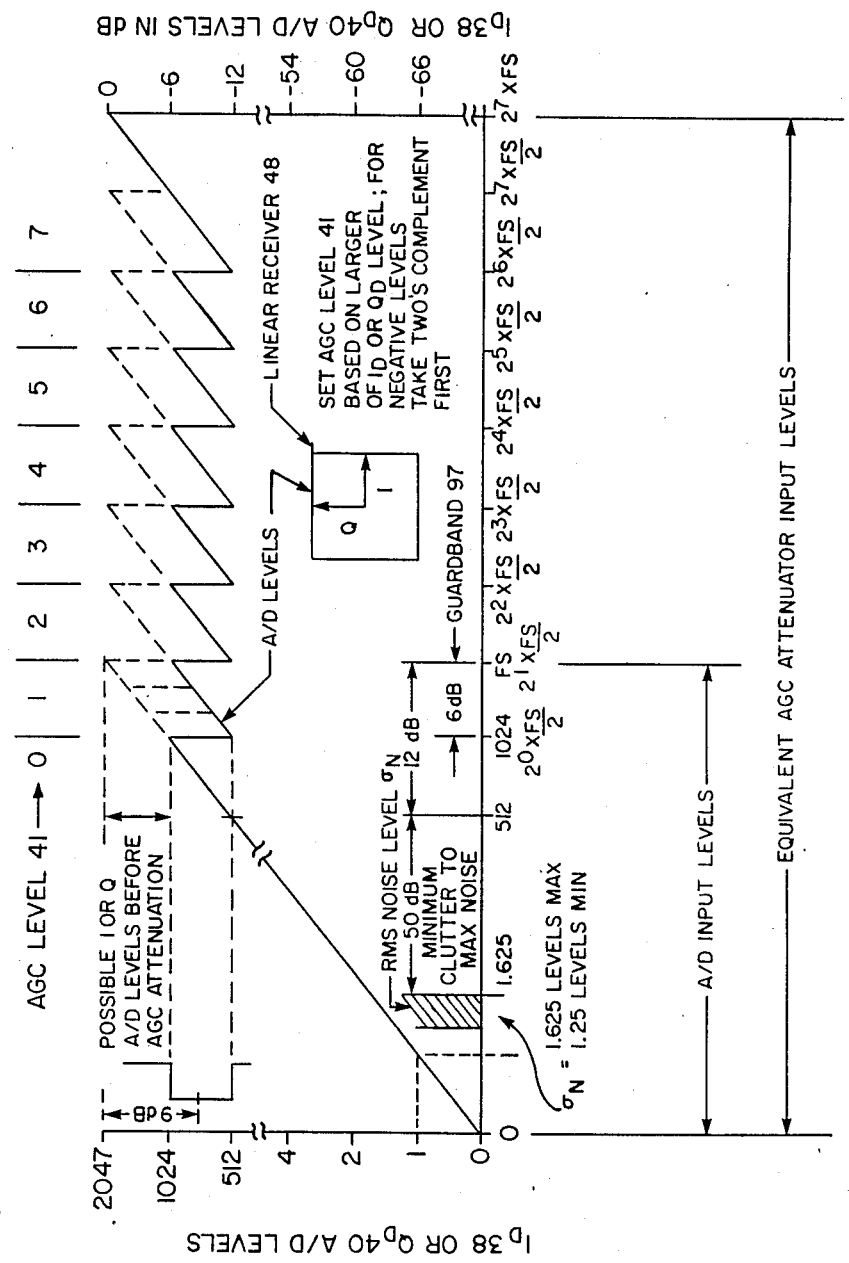
FIG. 2 shows a plot of the $I_D$ 38 or $Q_D$ 40 A/D level and the AGC level 41 in 6 dB increments with a 6 dB guardband for high pulse repetition frequency waveforms to provide a 50 dB minimum $I_D$ or $Q_D$ dynamic range for clutter suppression.
Figure 3:
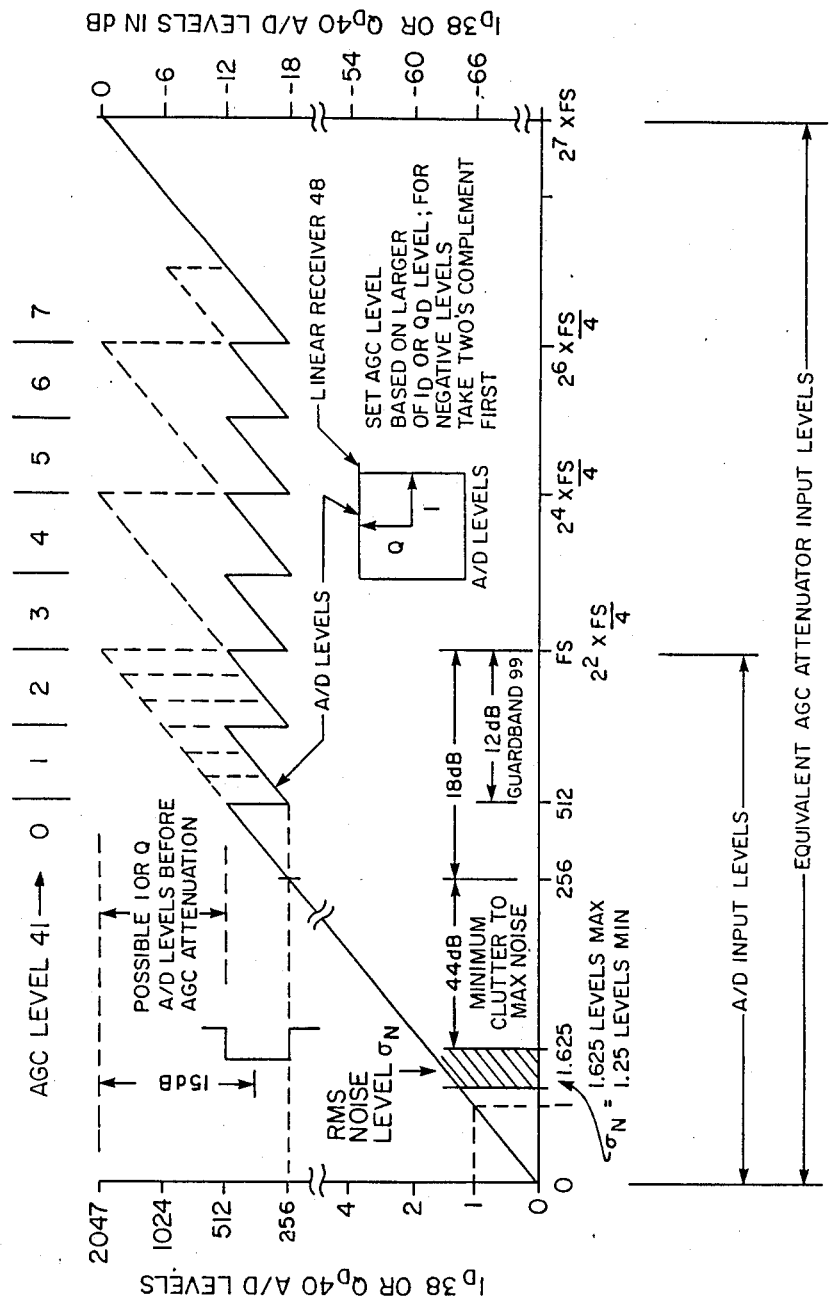
FIG. 3 shows a plot of the $I_D$ 38 or $Q_D$ 40 A/D level versus AGC level 41 in 6 dB increments with a 12 dB guardband for low pulse repetition frequency waveforms to provide a 44 dB minimum $I_D$ or $Q_D$ dynamic range for clutter suppression.

Referring now to FIG. 2 and FIG. 3, the performance of the present invention providing a total system dynamic range of 102 dB is shown. The A/D converters 30, 32 (FIG. 1) provide a dynamic range of 60 dB and the eight levels (0-7) of incremental AGC level 41 are in 6 dB increments to provide an additional 42 dB of dynamic range. The graphs plot the $I_D$ 38 or $Q_D$ 40 A/D levels versus AGC level 41 (0-7) in 6 dB increments for a 6 dB guardband (FIG. 2) and a 12 dB guardband (FIG. 3). The 6 dB guardband in FIG. 2 is used for high pulse repetition frequency (PRF) waveforms and the 12 dB guardband in FIG. 3 is used for low PRF waveforms.

As the PRI increases the guardband will increase due to more probability of a larger change in amplitude of the radar return signals. The change in amplitude from PRI to PRI is a function of radar and return signal parameters. In the weather radar application and most other radar applications only two guardbands are required, 6 dB for PRI's greater than 3 ms and 12 dB for PRI's less than 3 ms.

The ordinate axis scale in FIG. 2 and FIG. 3 for $I_D$ 38 or $Q_D$ 40 levels is shown ranging from 0 to 2047 on the left and it is also given on the right in dB units. The abscissa axis scale in FIG. 2 is shown going from zero to 1024 levels (FS/2) for the A/D converters 30, 32 and thereafter, the AGC levels provide the extended dynamic range of 42 dB in seven 6 dB increments. Each AGC level 41 increment representing a 6 dB attenuation factor of the A/D converted input signal corresponds to the floating point exponent of the $I_D$ 38 and $Q_D$ 40 data provided to a digital signal processor 50. The radar return signal level processed is $2^{AGC\ level\ 41} \times I_D 38$ and $2^{AGC\ level\ 41} \times Q_D 38$ data. In floating point number representation the AGC level 41 is the exponent and the A/D data is the mantissa; the AGC level 41 is the common $I_D$ 38 and $Q_d$ 40 exponent. Floating point number representations are described in many texts, one of which is "Computer Arithmetic—Principles, Architecture and Design", Kai Hwang, John Wiley & Sons 1979. For increasing radar return signals 15 the seven increments of the AGC level try to keep the absolute value of the larger of the $I_D$ 38 or $Q_D$ 40 A/D level within the 512 to 2047 level range for the 6 dB guardband (FIG. 2) and within the 256 to 2047 level range for the 12 dB guardband (FIG. 3) in order to prevent limiting in the A/D converters 30, 32 while maximizing the clutter to noise ratio for clutter suppression. The RMS noise level ($\sigma_N$) is nominally set at 1.45 A/D levels in the preferred embodiment. FIG. 2 and FIG. 3 do not show any negative levels because the absolute value of $I_D$ 38 and $Q_D$ 40 data are used to generate the seven increments of the AGC level 41. The two's complement of negative numbers generates the absolute value when $I_D$ 38 or $Q_D$ 40 are negative. The 12-bit A/D converters 30, 32 provide levels ranging from −2048 to +2047.

Still referring to FIG. 2 and FIG. 3, the Q vs I A/D levels of the linear receiver 48 are shown to point out that limiting occurs in the A/D converters 30, 32. The A/D converters 30, 32 limit at maximum positive for analog input levels greater than positive (+) full scale (FS) and at maximum negative for analog input levels less than negative (−) FS. In the present embodiment one A/D level is equivalent to 5 volts (V) divided by 2048 levels for a 5 V full scale A/D converter. The video amplifiers 26, 28 in receiver 48 limit at twice the maximum A/D full scale input voltage to protect the A/D converters 30, 32. Since the AGC level 41 is determined based on the larger of the $I_D$ or $Q_D$ level, exact levels are obtained for AGC generation and not approximations as in the prior art where gain adjustments were performed either prior to the A/D converter or on the A/D magnitude $(I^2+Q^2)^{\frac{1}{2}}$. *As previously noted, no negative* $I_D$ or $Q_D$ levels occur because of using absolute values of the two's complement number representation. The A/D linear dynamic range is defined in decibels as follows:

$$20 \text{ LOG}_{10}\left[\frac{\text{RMS sine wave signal}}{\text{RMS noise level}}\right]$$

In the present embodiment the I or Q A/D linear dynamic range is as follows:

$$20 \text{ LOG}_{10}\left[\frac{FS \cos 45°}{\sigma_N}\right] =$$

$$20 \text{ LOG}_{10}\left[\frac{2048 \cos 45°}{1.45}\right] = 60 \text{ dB}$$

and the I and Q linear dynamic range is as follows:

$$20 \text{ LOG}_{10}\left[\frac{\sqrt{(I_{FS}\cos 45°)^2 + (Q_{FS}\sin 45°)^2}}{\sqrt{\sigma_{NI}^2 + \sigma_{NQ}^2}}\right]$$

$$20 \text{ LOG}_{10}\left[\frac{\sqrt{(2048\cos 45°)^2 + (2048\sin 45°)^2}}{\sqrt{1.45^2 + 1.45^2}}\right] = 60 \text{ dB}$$

The eight AGC levels (0–7) of AGC level 41 provide the additional 42 dB of dynamic range for a total system dynamic range of 102 dB.

Stationary clutter at video or baseband is a peak or DC level. The minimum clutter to noise ratio for clutter suppression is defined as the ratio of the peak or DC clutter level (C) to the maximum RMS noise level. The minimum clutter to RMS noise level for high PRF waveforms in dB for the I or Q A/D is shown in FIG. 2, and is as follows:

$$20 \text{ LOG}_{10}\left[\frac{C}{\sigma_N}\right] =$$

$$20 \text{ LOG}_{10}\left[\frac{512 \text{ Levels } I_D 38 \text{ or } Q_D 40}{1.625 \text{ Levels } \sigma_N \text{ Max}}\right] = 50 \text{ dB MIN}$$

Statistically all A/D levels are equally probable; however, the average $I_D$ 38 or $Q_D$ 40 A/D level is 9 dB down from 2047 levels for the 6 dB guardband shown in FIG. 2. The average RMS noise level is half-way between 1.25 and 1.625 levels or 1.45 levels RMS and the typical or average clutter to noise ratio for clutter suppression is as follows:

$$20 \text{ LOG}_{10}\left[\frac{\sqrt{2} \times 512 \text{ levels } I_D 38 \text{ or } Q_D 40}{1.45 \text{ Levels } \sigma_N}\right] = 54 \text{ dB typical}$$

The I and Q clutter to noise ratio for clutter suppression is the same, 50 dB minimum and 54 dB typical.

The minimum clutter to RMS noise level for low PRF waveforms in dB is shown in FIG. 3 and is as follows:

$$20 \text{ LOG}_{10}\left[\frac{C}{\sigma_N}\right] =$$

$$20 \text{ LOG}_{10}\left[\frac{256 \text{ Levels } I_D 38 \text{ or } Q_D 40}{1.625 \text{ Levels } \sigma_N \text{ Max}}\right] = 44 \text{ dB MIN}$$

The average $I_D$ 38 or $Q_D$ 40 A/D level is 15 dB down from 2047 levels for the 12 dB guardband shown in FIG. 3. The typical or average clutter to noise ratio for clutter suppression is:

$$20 \text{ LOG}_{10}\left[\frac{\sqrt{2} \times 256 \text{ Levels } I_D 38 \text{ or } Q_D 40}{1.45 \text{ Levels } \sigma_N}\right] = 48 \text{ dB typical}$$

The I and 0 clutter to noise ratio for clutter suppression is the same, 44 dB minimum and 48 dB typical.

Figure 4:
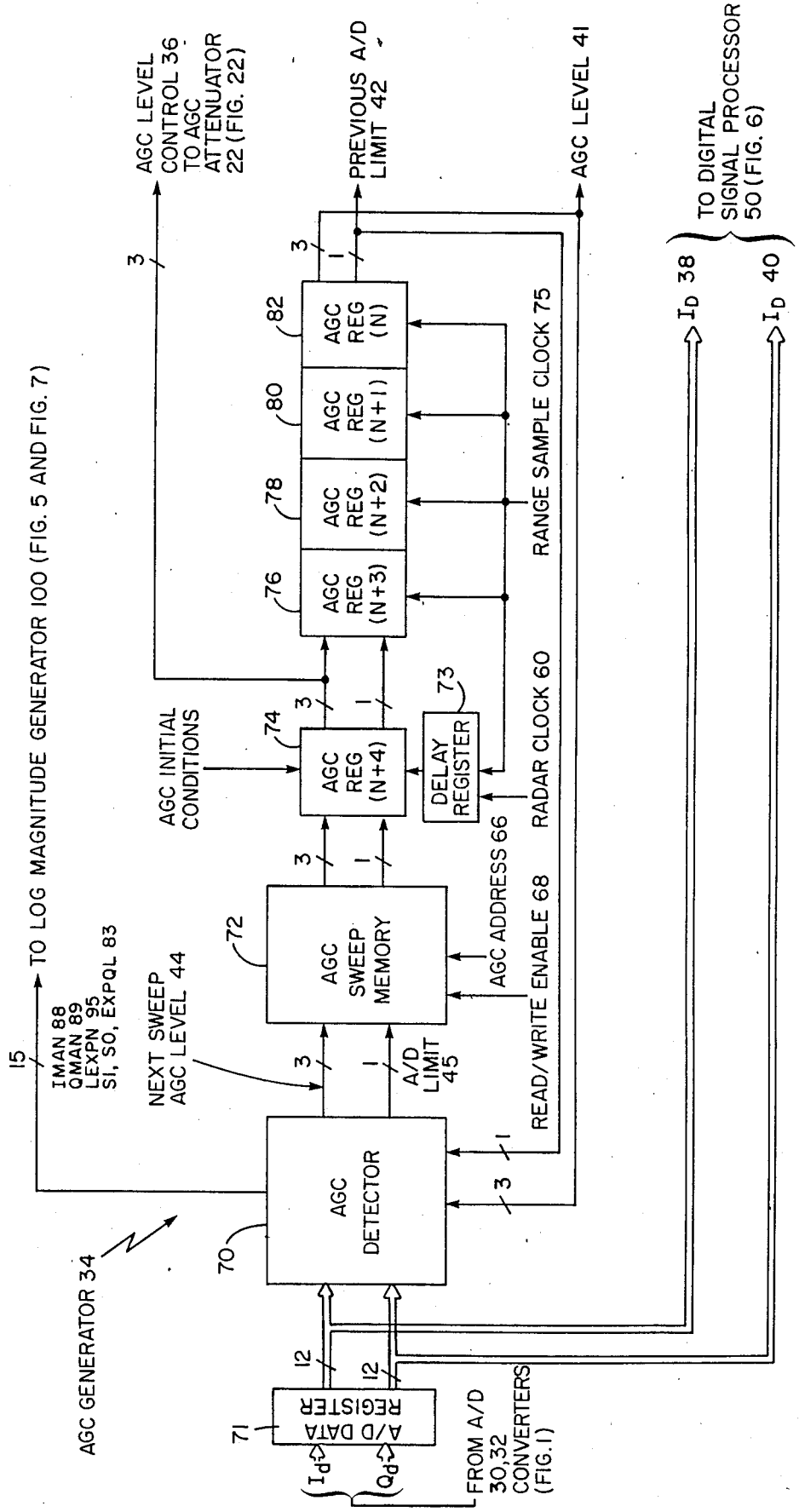
FIG. 4 is a functional block diagram of the AGC generator of the invention.

Referring now to FIG. 4 there is shown a block diagram of the AGC generator 34 comprising an A/D data register 71 for storing the $I_d$ and $Q_d$ data for one range sample period, and an AGC detector 70 for determining a present A/D limit 45 condition and the correct next sweep AGC level 44 to be used for sampling the same range cell of data in the next sweep by examining the present sweep AGC level 41, $I_D$ 38 and $Q_D$ 40 data, the present A/D limit 45 and the previous A/D limit 42 for the same range cell in the previous sweep. In addition, the AGC generator 34 comprises an AGC sweep memory 72 organized as 2048 words×4 bits (one storage location for each range cell) for storing the 3-bit next sweep AGC level 44 word and A/D limit 45 bit. The AGC sweep memory 72, accessed for each range cell in the current sweep, uses the AGC register (N+4) 74 to hold the AGC level control 36 or sets the AGC initial condition setting to predetermined level zero at power turn-on and transfers it to the AGC attenuator 22 (FIG. 1). The range sample clock 75 generates an AGC address 66 for each range cell. Data is read (accessed) for each range cell from the AGC sweep memory 72 into the AGC REG (N+4) 74 three radar clock 60 counts (provided by delay register 73 which allows for propagation times) after the occurrence of the range sample clock 75. The AGC generator 34 further comprises four registers, AGC reg (N+3) 76, AGC reg (N+2) 78, AGC reg (N+1) 80 and AGC reg (N) 82, for delaying the feed-forward AGC level control 36 word and previous sweep A/D limit 42 bit until the $I_D$ 38 and $Q_D$ 40 data is received that corresponds to the data's associated AGC level control 36 word. The range sample clock 75 shifts the AGC level control 36 word and associated previous A/D limit bit through four registers 76–82 providing four range sample delays whereby the first delay allows the AGC attenuator 22 transient response to settle to one-half an A/D LSB; the second delay permits the A/D conversion to occur; and the third delay allows time for the $I_D$ 38 and $Q_D$ 40 data to be transferred out of the A/D converter 30, 32 and the fourth delay provides for aligning in time the $I_D$ 38 and $Q_D$ 40 data in A/D data register 71 with its associated 3-bit AGC level control 36 (which is now referenced as AGC level 41) and 1-bit previous A/D limit 42 in AGC REG (N) 82. $I_D$ 38 and $Q_D$ 40 data is fed forward to the AGC detector 70 and to the digital signal processor 50 for further processing. Now the AGC detector 70 calculates the next sweep AGC level 44 and A/D limit 45 and stores the data in the AGC sweep memory 72 using the same AGC address 66 value that was used to read the memory 72 four range samples earlier to compensate for the four delays through register 76-82. In this way the same AGC memory address 66 is used in conjunction with read/write enable 68 to read or write to the memory for a particular range cell.

The critical functions for the AGC generator 34 are: A/D limit detection, handling initial conditions, and setting the AGC level for staying within the linear A/D dynamic range. Limit detection for each range cell is monitored and the first PRI sweep that A/D limit 45 is detected changes the AGC level setting for this range cell by the minimum amount of 6 dB (+1 AGC level) for high PRF waveforms and 12 dB (+2 AGC levels) for low PRF waveforms. When present A/D limiting 45 is detected in the present PRI sweep, and the previous A/D limit 42 bit is set in the AGC sweep memory 72 due to limiting on the previous PRI sweep, the AGC setting is changed for this range cell 12 dB (+2 AGC levels) for high PRF waveforms and 18 dB (+3 AGC levels) for low PRF waveforms (see Table 6). The power-on initial conditions set the AGC level control 36 to predetermined level zero for each range cell and therefore, with A/D limit detection and control it takes a maximum of 4 PRI sweeps for the high PRF waveforms to come out of limit and 3 PRI sweeps for the low PRF waveforms when the return signal's dynamic range is less than 102 dB.

When the A/D 30, 32 is driven into limit due to pulse interference, pulse interference is not detected until the next PRI sweep interval. A/D limit detection and control keep pulse interference from controlling the AGC setting using previous A/D limit 42 and present A/D limit 45 as described hereinbefore. The A/D limit detection and control with the 6 dB or 12 dB guardbands shown in FIGS. 2 and 3 provide a fast response equivalent to instantaneous AGC. The AGC level control 36 extends the linear dynamic range of the receiver and A/D converters for digital signal ( processing, i.e. clutter filtering and return signal para-meter estimation. Limiting due to return signal fluctuations only occurs when the AGC levels are small and have negligible effect, measured in tenths of dB's for clutter filtering and parameter estimation.

When radar return signals fade by dropping 12 dB or more below full scale (FS) for the 6 dB guardband in the larger exponent range 0-10 or 18 dB or more below FS for the 12 dB guardband in the larger exponent range 0-9, the AGC setting is reduced by 6 dB or one AGC level as shown in Table 6. Reducing the AGC setting by only 6 dB for a range cell in any PRI sweep keeps return signal fades from going into limit and perturbing the digital signal processing when the faded radar return signal returns to its actual value Referring now to FIG. 5, the AGC detector 70 converts the fixed point binary $I_D$ 38 and $Q_D$ 40 data to their absolute value and converts the absolute value to normalized floating point data having an exponent and a mantissa for both $I_D$ and $Q_D$. The most significant A/D bit set of the absolute value generated from the $I_D$ 38 and $Q_D$ 40 fixed point numbers determines the exponent and the MSB of the normalized floating point mantissa as shown in Tables 2 and 3. Bits after the LSB of $I_D$ 38 and $Q_D$ 40 are zero-filled. The largest exponent value (LEXPN 95) generated from the fixed point $I_D$ 38 and $Q_D$ 40 data is selected and the A/D limit 45 bit is set if $I_D$ 38 or $Q_D$ 40 were in limit. The AGC detector 70 determines the next sweep AGC level 44 and provides input data to a log magnitude generator 100.

TABLE 2

NORMALIZED FLOATING POINT CONVERTER FOR POSITIVE NUMBERS

If A/D Data = +2046 or +2047 set the exponent = 15 for A/D overflow detection. The largest exponent selector 94 uses this exponent to set the A/D limit 45 bit and sets the largest exponent, LEXPN 95, to 12.

If A/D Data = 0, set exponent = 0; otherwise the most significant A/D data bit set determines the exponent.

$I_D$ 38 or $Q_D$ 40 Data Bits (positive sign + 11 Bits):
Data Bits: 0 X X X   XXXX XXXX (LSB)
Exponent  12 11 10 9 8 7 6  5 4 3 2

The 4 Bit Exponent Scale (0 to 12) = IEXPN 91 or QEXPN 93
    4 Bit Exponent:  IEXP3   IEXP2   IEXP1   IEXP0
                     QEXP3   QEXP1   QEXP1   QEXP0
       Equivalent dB Scale:   48      24      12       6

The 4 Data Bits = 4 MSB's of Normalized Number
(IMAN 88 or QMAN 89)
A/D DATA INPUTS                OUTPUTS

| $I_D$ 38 Data | $Q_D$ 40 Data | | | | |
|---|---|---|---|---|---|
| I11 (SIGN) | Q11 (Sign = 0 | IEXP3 | | QEXP3 | |
| I10 (MSB)  | Q10 for Pos.  | IEXP2 | IEXPN 91 | QEXP2 | QEXPN 93 |
| I9         | Q9  Nos.)     | IEXP1 | | QEXP1 | |
| I8         | Q8            | IEXP0 | | QEXP0 | |

TABLE 2-continued
NORMALIZED FLOATING POINT CONVERTER FOR POSITIVE NUMBERS

| | | | | | |
|---|---|---|---|---|---|
| I7 | Q7 | | | | |
| I6 | Q6 | IMAN10 ⎫ | | QMAN10 ⎫ | |
| I5 | Q5 | IMAN9 ⎬ IMAN 88 | | QMAN9 ⎬ QMAN 89 | |
| I4 | Q4 | IMAN8 ⎬ | | QMAN ⎬ | |
| I3 | Q3 | IMAN7 ⎭ | | QMAN7 ⎭ | |
| I2 | Q2 | | | | |
| I1 | Q1 | | | | |
| I0 (LSB) | Q0 | | | | |

TABLE 3
NORMALIZED FLOATING POINT CONVERTER FOR NEGATIVE NUMBERS

For Negative Data if level is −2048, set absolute value to +2047; otherwise take two's complement of the negative data to determine the absolute value of the negative number.

If A/D Data = +2046 or +2047 set the exponent = 15 for A/D overflow detection.
The largest exponent selector 94 uses this exponent to set the A/D limit 45 bit and sets the largest exponent, LEXPN 95, to 12. Otherwise the Most Significant 2's Complement Data Bit Set Determines the Exponent.

$I_D$ 38 or $Q_D$ 40 Data Bits (Negative Sign + 11 Bits)
2's Complement #: 0 X X X  XXXX XXXX (LSB)
Exponent         12 11 10 9 8 7 6 5 4 3 2

The 4 Bit Exponent Scale (0 to 12) — IEXPN 91 or QEXPN 93
```
        4 Bit Exponent:  IEXP3    IEXP2    IEXP1    IEXP0
                         QEXP3    QEXP1    QEXP1    QEXP0
     Equivalent dB Scale:  48      24       12        6
```

The 4 Data Bits = 4 MSB's of Normalized 2's Complement Number (IMAN 88 or QMAN 89)

A/D DATA INPUTS               OUTPUTS

| $I_D$ 38 Data | $Q_D$ 40 Data | | | | | |
|---|---|---|---|---|---|---|
| I11 (SIGN) | Q11 (Sign = 1 | IEXP3 ⎫ | | QEXP3 ⎫ | | |
| I10 (MSB) | Q10 for Neg. | IEXP2 ⎬ IEXPN 91 | | QEXP2 ⎬ QEXPN 93 | | |
| I9 | Q9 Nos.) | IEXP1 ⎬ | | QEXP1 ⎬ | | |
| I8 | Q8 | IEXP0 ⎭ | | QEXP0 ⎭ | | |
| I7 | Q7 | | | | | |
| I6 | Q6 | IMAN10 ⎫ | | QMAN10 ⎫ | | |
| I5 | Q5 | IMAN9 ⎬ IMAN 88 | | QMAN9 ⎬ QMAN 89 | | |
| I4 | Q4 | IMAN8 ⎬ | | QMAN8 ⎬ | | |
| I3 | Q3 | IMAN7 ⎭ | | QMAN7 ⎭ | | |
| I2 | Q2 | | | | | |
| I1 | Q1 | | | | | |
| I0 (LSB) | Q0 | | | | | |

The fixed point $I_D$ 38 data is converted to normalized floating point by the normalized floating point converter 90 and the fixed point $Q_D$ 40 data is converted to normalized floating point by the normalized floating point converter 92. The normalized floating point number representation is the most efficient method of determining the next sweep AGC level 44 and calculating the log magnitude. The weighting of the bits of the log magnitude output easily interfaces two common principles. The first principle is the notion of log magnitude in decibels defined as follows:

Log Magnitude In Decibels (dB) = 20 log$_{10}$
$[(I_D^2 + Q_D^2)^{\frac{1}{2}}]$ The second principle is the common use of binary powers of two (2) in digital circuitry. The weighting of the bits interfaces these two principles as follows:

20 log$_{10}$[2] = +6 dB or 20 log$_{10}$[½] = −6 dB

These two equations show that any change in exponent corresponds to a 6 dB change in the log magnitude. The largest exponent LEXPN 95 used to determine the next sweep AGC level 44 is used also to provide a coarse A/D log magnitude in 6 dB steps. The I and Q mantissas (IMAN 88 and QMAN 89) are used to fine tune the log magnitude between the range of +3 dB and −6 dB to the required accuracy. For an accuracy of ¾dB only the 4 MSB's of the mantissas' absolute value are required to correct the coarse log magnitude between the range of +3 dB and −6 dB.

Figure 5:
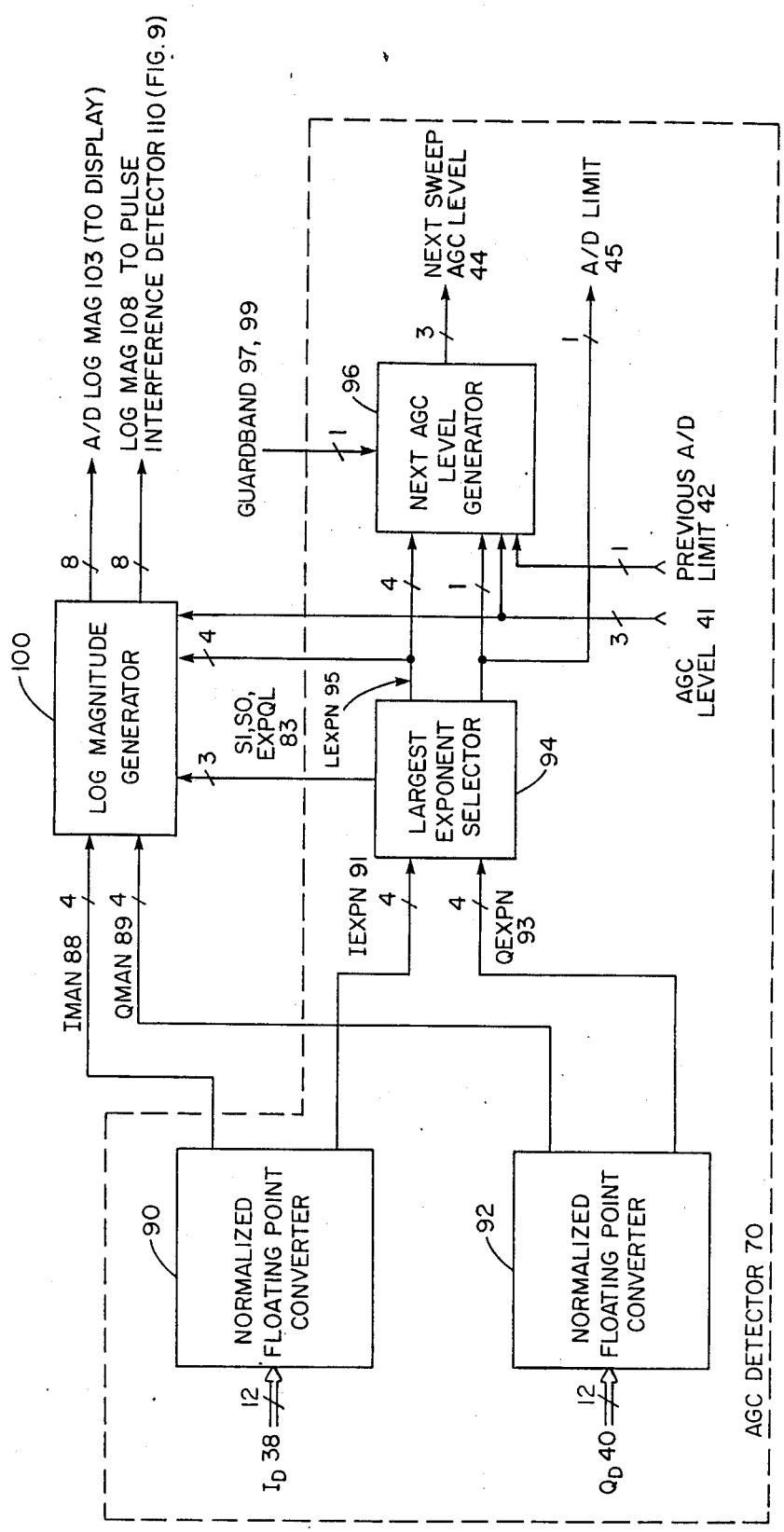
FIG. 5 is a block diagram of an AGC detector within the AGC generator used to develop the AGC levels shown in FIG. 2 and FIG. 3 and the signals provided to a log magnitude generator.

Still referring to FIG. 5, the functional logic required to implement the normalized floating point converters 90, 92 is specified by Tables 2 and 3 and may be implemented with discrete integrated circuits, semiconductor memory devices such as PROMS or ROMS, or logic arrays such as PLA's or PAL's readily known to one of ordinary skill in the art. Tables 2 and 3 specify the logic required in each converter 90, 92 for converting the fixed point numbers $I_D$ 38 data and $Q_D$ 40 data. Using the 12-bit absolute number of the $I_D$ 38 or $Q_D$ 40 data inputs, the first bit after the sign bit which is set from left to right determines the exponent and the exponent corresponding to each data bit position is shown in Tables 2 and 3. This number assigned to the exponent is used to determine the next sweep AGC level 44 and allows a direct addition of the largest exponent (LEXPN 95) for obtaining the log magnitude (log mag 108). Any exponent number assignment that is sequential can be used for determining the next sweep AGC level 44. The number assignment in the preferred embodiment was selected to optimize the log magnitude calculation. Since each exponent corresponds to a 6 dB increment or step, this direct addition is possible if the least significant bit (LSB) of the exponent (IEXP0, OEXP0) has a weight of 6 dB as shown in Tables 2 and 3. The mantissa portion (IMAN 88 or OMAN 89) is determined by taking the absolute value of the 12-bit input, normalizing it and extracting the 4 MSB's of the final value (not including the sign bit). For example, to determine the exponent of the 12-bit fixed point absolute value of the $I_D$ 38 binary number 000000001000 which has input data bit position I3 = 1, Table 2 shows that when I3 = 1, the exponent equals 5 and the IEXPN 91 outputs from the converter 90 will be IEXP3=0, IEXP2=1, IEXP1=0 and IEXP0=1. The mantissa will be the 4 MSBs of the normalized $I_D$ word which in this example are IMAN10=1, IMAN9=0, IMAN8=0 and IMAN7=0. The 4 MSBs of the mantissa portion (IMAN 88 and OMAN 89) of the normalized floating point numbers are coupled to a log magnitude generator 100 where a log magnitude is generated accurate to $\frac{3}{4}$dB based on using the 4 MSBs. The larger exponent (LEXPN 95) of the two exponents IEXPN 91 and QEXPN 93 determined by a largest exponent selector 94 is also sent to the log magnitude generator to provide coarse values of the log magnitude in 6 dB steps. The reduced accuracy of the mantissa is used to fine tune the log magnitude between the range of +3 dB to −6 dB. Table 3 primarily differs from Table 2 by specifying that the two's complement be formed (i.e. invert the binary bits and add 1 to the LSB) of the $I_D$ 38 and $Q_D$ 40 data when such data is a negative number.

As stated hereinbefore, the exponent IEXPN 91 and QEXPN 93 of the floating point numbers for $I_D$ 38 and $Q_D$ 40 are coupled to the largest exponent selector 94 which examines the magnitude of each exponent and determines the largest of the two exponents specified by a four bit word, LEXPN 95, having bit positions LEXP3, LEXP2, LEXP1, LEXP0. Table 4 specifies the logic for performing the functions required of the largest exponent selector 94. If either IEXPN 91 or QEXPN 93 equals 15, then an A/D overflow detection has occurred wherein the largest exponent (LEXPN 95) is set to 12 for selecting the next sweep AGC level 44 and for the log magnitude calculation, and the A/D limit 45 bit is set. If the $Q_D$ exponent (QEXPN 93) is the largest, then an EXPQL bit is set; if the $I_D$ exponent (IEXPN 91) is the largest, then EXPQL is cleared except for the case when both $I_D$ 38 and $Q_D$ 40 inputs are zero and then EXPQL=1, S1=0 and S0=0 which defines a 0 db log magnitude correction for such a zero data condition. Control bits S1 and S0 are set depending on the difference between the largest and smallest exponents and are used in a log magnitude generator 100 to denormalize the smaller exponents' mantissa depending on the difference between the larger and smaller exponents, IEXPN 91 and QEXPN 93, as specified in Table 4 by performing the function indicated in the denormalize column.

TABLE 4

LOGIC FOR LARGEST EXPONENT SELECTOR

If either $I_D$ or $Q_D$ Exponent (IEXPN 91 or QEXPN 93) = 15 it means A/D limit detection occurred and the largest exponent LEXP3 to LEXP0 is set to 12 for selecting the next AGC level and for the log magnitude calculations and the A/D limit 45 bit is set; otherwise, the A/D 45 limit bit is cleared and LEXPN 95 is set to the larger of IEXPN 91 and QEXPN 93.

EXPQL is set if Q exponent (QEXPN 93) is larger and cleared when I exponent (IEXPN 91) is larger; when the exponents are equal, EXPQL is cleared except for the case when both $I_D$ and $Q_D$ A/D inputs are zero (code EXPQL=1, S1=0, S0=0 defines 0 dB log magnitude correction).

Control bits S0, S1 are set depending on the difference between the larger and smaller exponents to denormalize the smaller exponents mantissa as follows:

| DIFFERENCE OF $I_D$ and $Q_D$ Exponent (largest−smallest) | S1 | S0 | Denormalize |
|---|---|---|---|
| 0 | 0 | 0 | ×0 |
| 1 | 0 | 1 | ÷2 |
| 2 | 1 | 0 | ÷4 |
| > or = 3 | 1 | 1 | ×0 |

| INPUTS | | OUTPUTS | | |
|---|---|---|---|---|
| IEXP3 | | | A/D LIMIT | 45 A/D limit bit set when IEXPN 91 or QEXPN 93 = 15 |
| IEXP2 | IEXPN 91 | | | |
| IEXP1 | | S1 | | Denormalize Smaller |
| IEXP0 | | S0 | 83 | exponent by ×1, ÷2, ÷4, ×0 |
| | | EXPQL | | Q Exponent is larger |
| | | | | |
| QEXP3 | | LEXP3 | | |
| QEXP2 | QEXPN 93 | LEXP2 | | Largest Exponent (LEXPN 95) |
| QEXP1 | | LEXP1 | | |

TABLE 4-continued
LOGIC FOR LARGEST EXPONENT SELECTOR

| QEXP0 | LEXP0 |
|---|---|

Still referring to FIG. 5 the next AGC level generator 96 produces the next sweep AGC level 44, a 3-bit digital word based on the present AGC level, the previous sweep A/D limit 42, the present sweep A/D limit 45, the largest exponent (LEXPN 95), and the particular guardband 97, 99 selected (6 dB or 12 dB). The logic for performing the functions of the next AGC level generator 96 is described in Tables 5 and 6. Table 6 shows the changes in the AGC level 41 for all possible A/D levels for the two guardbands, 6 dB and 12 dB.

Referring to Tables 2, 3, 5 and 6, all that are required to calculate the next sweep AGC level 44 are the exponent number assigned to the $I_D$ 38 or $Q_d$ 40 data, the A/D limit conditions (previous A/D limit 42 and present A/D limit 45), the guardband 97, 99 and the AGC level 41. The logic for AGC level 41 calculation is defined in Tables 5 and 6. As previously described, the logic for the exponent number of the $I_D$ 38 or $Q_D$ 40 data is defined in Tables 2 and 3. The first $I_D$ 38 or $Q_d$ 40 data bit after the sign bit which is set from left to right determines the exponent. When the AGC level 41 is decremented by $-1$, it is limited to zero minimum thereby preventing the next AGC level 44 from going negative. Whenever the AGC level 41 is incremented, the maximum next AGC level 44 is limited to 7. This limit is set depending on the number of bits used to control the AGC attenuator 22, 3 bits in the present embodiment.

TABLE 5
LOGIC FOR NEXT AGC LEVEL GENERATOR 96

Limit change in AGC level 41 to 0 MIN and 7 MAX to determine next sweep AGC level 44.

6 dB Guardband 97:

If A/D data is within A/D levels 512 to 1023, then change AGC level 41 by +0

If A/D data is less than 512 levels, then change AGC level 41 by $-1$

If A/D data is within the 6 dB guardband 97, then change AGC level 41 by +1, except when previous A/D limit 42 and present A/D limit 45 are set, then change AGC level 41 by +2.

12 dB Guardband 99:

If A/D data is within A/D levels 256 to 511, then change AGC level 41 by +0

If A/D data is less than 256 levels, then change AGC level 41 by $-1$

If A/D data is within the 12 dB guardband 99 and also within A/D levels 512 to 1023, then change the AGC level 41 by +1.

If A/D data is within the 12 dB guardband 99 and also within A/D levels 1024 to 2047, then change the AGC level 41 by +2 except when previous A/D limit 42 and present A/D limit 45 bits are set, then change AGC level 41 by +3.

| INPUTS | OUTPUTS | |
|---|---|---|
| Previous Sweep A/D Limit 42 | NAGC2 | Next Sweep AGC Level 44 |
| Present Sweep A/D Limit 45 | NAGC1 | |
| Guardband 6 dB 97 or 12 dB 99 | NAGC0 | |
| LEXP3 | | |
| LEXP2 | Largest Exponent (LEXPN 95) | |
| LEXP1 | | |
| LEXP0 | | |
| AGC2 | | |
| AGC1 | Present AGC Level 41 | |
| AGC0 | | |

TABLE 6
LOGIC FOR AGC LEVEL CALCULATION
(LIMIT CHANGE IN AGC LEVEL 41 TO 0 MIN & 7 MAX)

| $I_D$ 38 or $Q_D$ 40 Data For the Largest Exponent (Present Sweep) | Larger IEXPN 91 or QEXPN 93 Exponent | Previous Sweep A/D Limit 42 | Change in AGC Level 41 to Determine Next Sweep AGC Level 44 | |
|---|---|---|---|---|
| | | | 6dB Guard Band | 12dB Guard Band |
| LIMIT +2047 | 15* | 1 | +2 | +3 |
| LIMIT +2046 | 15* | 0 | +1 | +2 |
| 0 1 (Except Limit Cases Above) | 12 | X | +1 | +2 |
| 0 01X,XXXX,XXXX | 11 | X | +0 | +1 |
| 0 001,XXXX,XXXX | 10 | X | $-1$ | +0 |
| 0 000,1XXX,XXXX | 9 | X | $-1$ | $-1$ |
| 0 000,01XX,XXXX | 8 | X | $-1$ | $-1$ |
| 0 000,001X,XXXX | 7 | X | $-1$ | $-1$ |
| 0 000,0001,XXXX | 6 | X | $-1$ | $-1$ |
| 0 000,0000,1XXX | 5 | X | $-1$ | $-1$ |
| 0 000,0000,01XX | 4 | X | $-1$ | $-1$ |
| 0 000,0000,001X | 3 | X | $-1$ | $-1$ |
| 0 000,0000,0001 | 2 | X | $-1$ | $-1$ |
| 0 000,0000,0000 Positive Sign Bit | 0 | X | $-1$ | $-1$ |

X = Don't Care
*When the largest exponent IEXPN 91 or QEXPN 93 is 15, set LEXPN 95 to 12 for the log magnitude calculation and set the present A/D limit 45 to indicate the A/D Data for the range cell in the present sweep is in limit.

The hardware implentation of the functions specified by Table 4, 5, and 6 may be embodied similarly as previously described for Tables 2 and 3 by the use of discrete integrated circuits, semiconductor memory devices such as PROMS and ROMS, or logic arrays such as PLA's or PAL's.

LOG MAGNITUDE PULSE INTERFERENCE DETECTION

Figure 6:
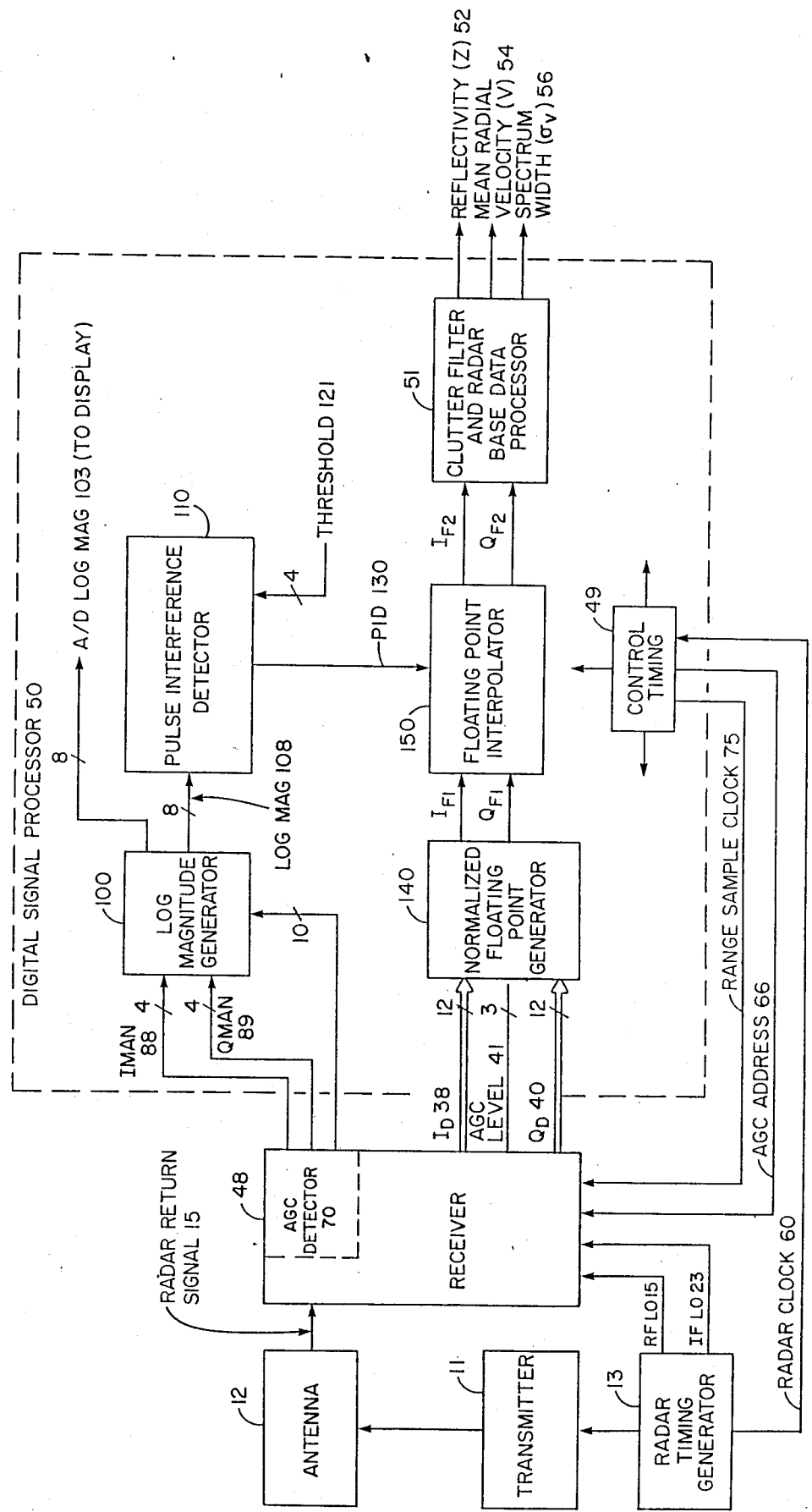
FIG. 6 shows a functional block diagram of a digital signal processor in a radar system employing a pulse interference detector and floating point interpolator.
Figure 7:
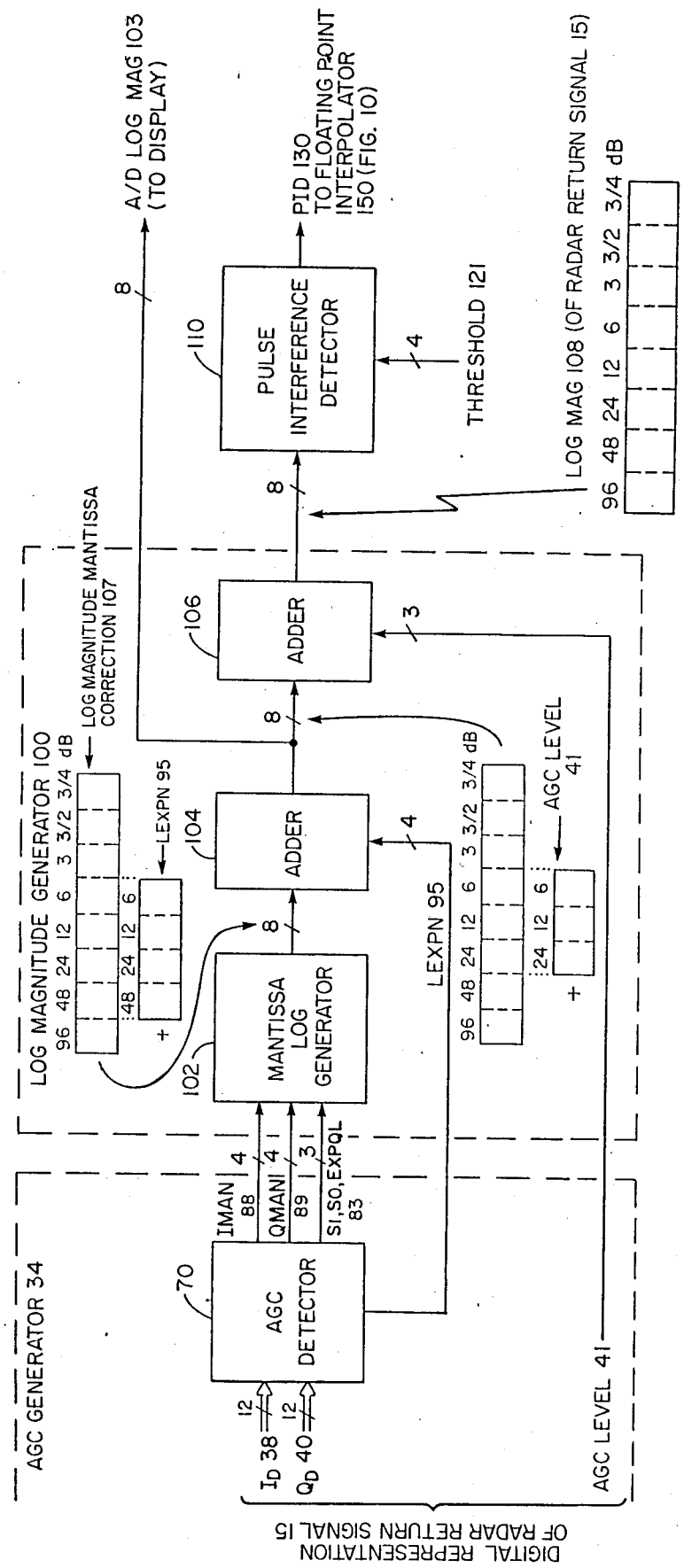
FIG. 7 is a functional block diagram of the invention showing a log magnitude generator coupled to a pulse interference detector.
Figure 8:
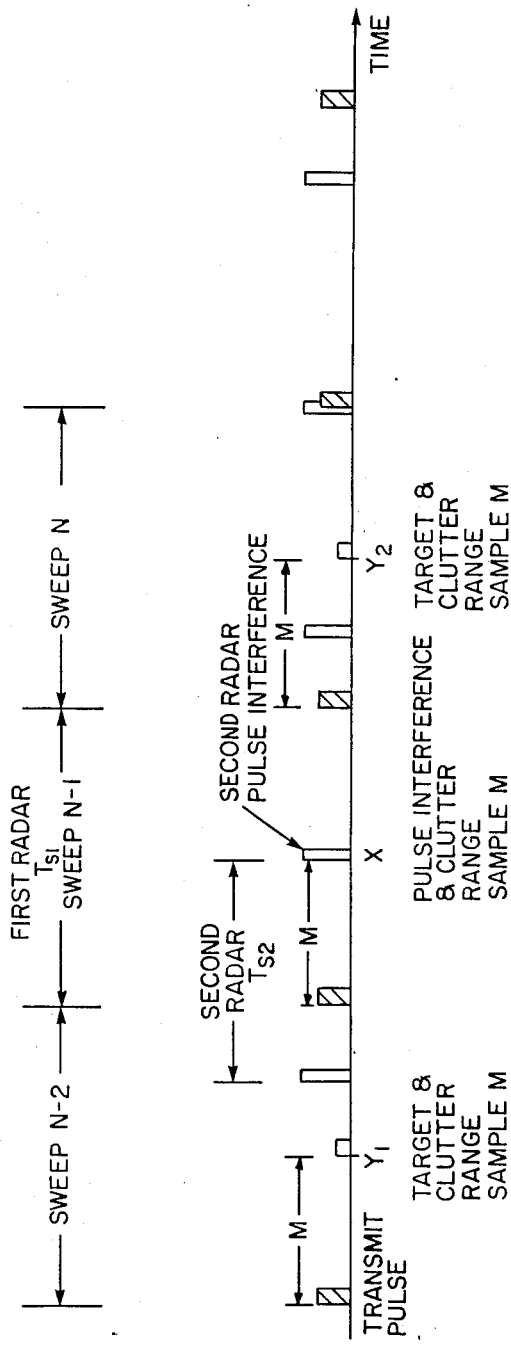
FIG. 8 illustrates a pulse interference from a second radar occurring at range M during sweep N−1 of a first radar.

Referring now to FIGS. 6, 7 and 8, a functional block diagram of the digital signal processor 50 coupled to receiver 48 is shown in FIG. 6 comprising means for performing pulse interference detection, rejection and replacement of an inter-fered-with radar return signal 15 or range sample by generating log magnitude values of the range samples and performing floating point interpolation of adjacent sweep range samples upon the occurrence of a single pulse of interference. If a pulse of interference occurs represented by pulse X in FIG. 8 during sweep N-1 of a first radar having a period TS1, the interfered-with range sample of the first radar is replaced with a synthesized range sample created by interpolating between non-interfered-with range sample M in the adjacent sweeps labeled sweep N-2 and sweep N in FIG. 8. A pulse interference detector 110 receives an 8-bit log magnitude (MAG) 108 word, which defines a radar return signal 15 using full receiver extended dynamic range, from the log magnitude generator 100. When a pulse of interference is detected, the pulse interference detector asserts a PID 130 signal which is coupled to a floating point interpolator 150 for selecting appropriate $I_{F2}$ and $Q_{F2}$ data to be processed by a clutter filter and radar base data processor 51 for generating the reflectivity (z) 52, mean radial velocity (v) 54 and spectrum width ($\sigma_v$) 56. A normalized floating point generator 140 receives the $I_D$ 38 and $Q_D$ 40 digital information of a particular range sample from the receiver 48 along with the AGC level 41 which was used to set the AGC attenuator 22 prior to converting that range sample data in the A/D converters 30, 32 to the $I_d$ and $Q_d$ or (delayed) $I_D$ 38 and $Q_d$ 40 digital information. The normalized floating point generator 140 transforms the $I_D$ 38 and $Q_D$ 40 fixed point-data to two's complement normalized floating point data, $I_{F1}$ and $Q_{F1}$, which is then coupled to the floating point interpolator 150. The transformation to two's complement floating point data facilitates the use of a monolithic floating point, arithmetic unit, such as model TDC 1022 manufactured by TRW LSI Products Division of La Jolla, CA 92038, to implement arithmetic functions in the floating point interpolator 150 as well as in the normalized floating point generator 140. The floating point interpolator 150 generates the synthesized data $I_{FY}$ and $Q_{FY}$, FIG. 10) for replacing the interfered-with pulse by interpolating the data of the non-interfered-with pulses in the adjacent sweeps shown in FIG. 8. The PID 130 signal selects the synthesized data for further processing if a pulse of interference is detected.

Referring now to FIG. 7 a functional block diagram of the log magnitude generator 100 is shown comprising a mantissa log generator 102. The logical functions of the mantissa log generator 102 are specified in Table 7, and as previously stated the logic may be implemented with discrete integrated circuits, semiconductor memory devices such as PROMs or ROMs, or with logic arrays such as PLAs or PALs readily known to one of ordinary skill in the art. The magnitude of the input signal sampled by A/D 30 and 32 is $(I_D{}^2+Q_d{}^2)1/2$ and the log magnitude generator 100 generates the log magnitude 108 value of normalized floating point numbers generated from $I_D$ 38 and $Q_d$ 40 A/D data defined by the following equation, for example, when IEXPN 91 is the largest exponent:

$$A/D \log \text{mag } 103 = 20 \log [((IMAN \cdot 2^{IEXPN})^2 +$$

$$(QMAN \cdot 2^{QEXPN})^2)^{\frac{1}{2}}] = 10 \log \left[ IMAN^2 \cdot 2^{2 \cdot IEXPN} + \left( \frac{QMAN}{2^{(IEXPN-QEXPN)}} \right)^2 \cdot 2^{2 \cdot IEXPN} \right] = 10 \log [2^{2 \cdot IEXPN}] +$$

log largest exponent $$10 \log \left[ IMAN^2 + \left( \frac{QMAN}{2^{(IEXPN-QEXPN)}} \right)^2 \right]$$

log mag mantissa

The log mag 108 is generated in dB with an accuracy of $\pm\frac{3}{4}$ dB. The eight output bits of log mag 108 are weighted from 96 db down to $\frac{3}{4}$ db as shown in FIG. 7.

TABLE 7

| LOGIC FOR MANTISSA LOG GENERATOR 102 |
|---|
| The mantissa log magnitude range is −6 dB to +3 dB<br>Used to correct or fine tune the log magnitude to + or − $\frac{3}{4}$ dB. The correction is sign extended to 8 bits. |
| The binary inputs IMAN(10-7) or QMAN(10-7) are normalized floating point numbers, except for zero. When both A/D $I_D$ and $Q_D$ data equal zero, the log magnitude correction is 0 dB, this is detected by the unique code S1, S0, EXPQL = 001. Otherwise, half level rounding is used to reduce the error by $\frac{1}{2}$ LSB for probability of rounding rather than truncation. |
| For $\frac{1}{2}$ level rounding set IMAN6 and QMAN6 equal to a binary 1 in the IMAN(10-7) and QMAN(10-7) inputs respectively. Then use EXPQL to determine the larger and smaller exponent and scale the mantissa with the smaller exponent by the S1, S0 code as follows: |

| S1 | S0 | Scale |
|---|---|---|
| 0 | 0 | ×1 |
| 0 | 1 | ×$\frac{1}{2}$ |
| 1 | 0 | ×$\frac{1}{4}$ |
| 1 | 1 | ×0 |

TABLE 7-continued
LOGIC FOR MANTISSA LOG GENERATOR 102

The lower normalized A/D bits IMAN (6-0) are discarded and are not required for the limited ¾dB accuracy. They are assumed to be at a value which is the mean of all possible values, namely half-way between all 0's and 1's. Therefore, set IMAN 6 and QMAN 6 equal to a binary 1 and calculate the log magnitude correction 107 by the following equation:

LOG MAGNITUDE CORRECTION (107) $= 20\text{LOG}_{10}[(\text{IMAN}(10\text{-}6))^2 + (\text{QMAN}(10\text{-}6))^2]^{\frac{1}{2}}$
$= 10\text{LOG}_{10}[(\text{IMAN}(10\text{-}6))^2 + (\text{QMAN}(10\text{-}6))^2]$

| INPUTS: | | | OUTPUTS: | 8 Bit Log Magnitude |
|---|---|---|---|---|
| IMAN10 | | | MANDB7 | Signed 2's Complement |
| IMAN9 | QMAN 89 | Q Mantissa | MANDB6 | 48 dB |
| IMAN8 | | Magnitude | MANDB5 | 24 dB |
| IMAN7 | | 4 MSBs | MANDB4 | 12 dB |
| | | | MANDB3 | 6 dB |
| QMAN10 | | I Mantissa | MANDB2 | 3 dB |
| QMAN9 | IMAN 88 | Magnitude | MANDB1 | 1.5 dB |
| QMAN8 | | 4 MSBs | MANDB0 | 0.75 dB |
| QMAN7 | | | | |
| S1 | | Denormalize smaller | | |
| S0 | 83 | ×1, ÷2, ÷4, ×0 | | |
| EXPQL | | Q Exponent is Larger | | |

The input data to the mantissa log generator 102 comprises IMAN 88 and QMAN 89 which are the 4 MSBs of the absolute value of normalized floating point $I_D$ 38 and $Q_D$ 40 quadrature data. The generation of IMAN 88 and QMAN 89 is described hereinbefore in regard to FIG. 5. Other inputs include the control bits S1 and S0 which represent the difference between the larger and smaller exponents (IEXPN 91 and QEXPN 93) of the floating point representations for $I_D$ 38 and $Q_D$ 40 and the EXPQL bit which is set when QEXPN 93 is larger thereby indicating which exponent is larger. These three bits, S1, S0, EXPOL 83 form a mantissa shift field or denormalizing control word and provide the information of how the two mantissas, IMAN 88 and QMAN 89, line up had they not been normalized in order to denormalize and set the exponents equal.

The mantissa log generator 102 computes the 8-bit log magnitude mantissa correction 107 from the equation (which employs half-level rounding) defined in Table 7. This output of the mantissa log generator 102 is coupled to adder 104 where it is added (aligned as shown on FIG. 7) to the largest exponent (LEXPN 95) which was generated by the largest exponent selector 94 and produces the A/D log mag 103 often useful for display purposes. This direct addition is made possible by the exponent numbering system selected.

Referring again to FIG. 5, the exponents IEXPN 91 and QEXPN 93 are generated by normalized floating point converters 90 and 92 respectively based on inputs $I_D$ 38 and $Q_D$ 40 respectively. Tables 2 and 3 show the decimal value assigned to the exponent IEXPN 91 or QEXPN 93 based on its corresponding input $I_D$ 38 or $Q_D$ 40. Table 2 explains the logic for positive numbers and Table 3 explains the logic for negative numbers. In either case (positive or negative input), the exponent is deter-mined by the most significant bit of the input ($I_D$ 38 or $Q_D$ 40) which is the opposite logic state of the sign bit. This 4-bit exponent (IEXPN 91 or QEXPN 93) has a dB equivalent as shown in Tables 2 and 3. As can be seen from Tables 2 and 3, the LSB of the output exponent (IEXPN 91 or QEXPN 93) corresponds to a dB scale value of 6 dB which has been chosen to easily interface the two common principles of the binary powers of two (2) in digital circuitry and the notion of decibels, as described here-inbefore. The two exponents IEXPN 91 and QEXPN 93 are then coupled to a largest exponent selector 94 which sets its output LEXPN 95 equal to the larger of the two inputs IEXPN 91 and OEXPN 93, with the one exception of the A/D limit case described in Table 4 when it sets its output LEXPN 95 equal to the decimal value 12, corresponding to 72 dB (the largest exponent value possible).

The output of the largest exponent selector 94, LEXPN 95, is coupled to binary adder 104 to be added (aligned as shown in FIG. 7) directly to the log magnitude mantissa correction 107. This addition is the digital circuit implementation of the A/D log mag 103 equation for the case when IEXPN $\geq$ QEXPN as follows:

$$A/D \text{ log mag } 103 = 10 \text{ LOG } [2^{2 \cdot IEXPN}] +$$

$$10 \text{ LOG} \left[ IMAN^2 + \left( \frac{QMAN}{2^{(IEXPN-QEXPN)}} \right)^2 \right]$$

And for this case,
$LEXPN\ 95 = 10 \text{ LOG } [2^{2 \cdot IEXPN}] = IEXPN\ (20 \text{ LOG } [2])$
LOG MAGNITUDE
MANTISSA CORRECTION 107 =

$$10 \text{ LOG} \left[ IMAN^2 + \left( \frac{QMAN}{2^{(IEXPN-QEXPN)}} \right)^2 \right]$$

Therefore,
$A/D$ LOG MAG 103 = $LEXPN$ 95 +
   LOG MAGNITUDE MANTISSA CORRECTION 107

Still referring to FIG. 7 the A/D log mag 103 can now be directly added to the AGC level 41 which was used when sampling a radar return signal 15 converted to $I_D$ 38 and $Q_D$ 40. This addition in adder 106 results in an 8-bit log magnitude 108 which covers the full dynamic range of the radar to an accuracy of $\pm\frac{3}{4}$'dB. The final accuracy of the 8-bit log magnitude 108 is determined by the precision of the output of the mantissa log generator 102. This log magnitude mantissa correction 107 can range from −6 dB to +3 dB corresponding to its minimum and maximum inputs respectively (excluding the special case of zero inputs).

Figure 9:
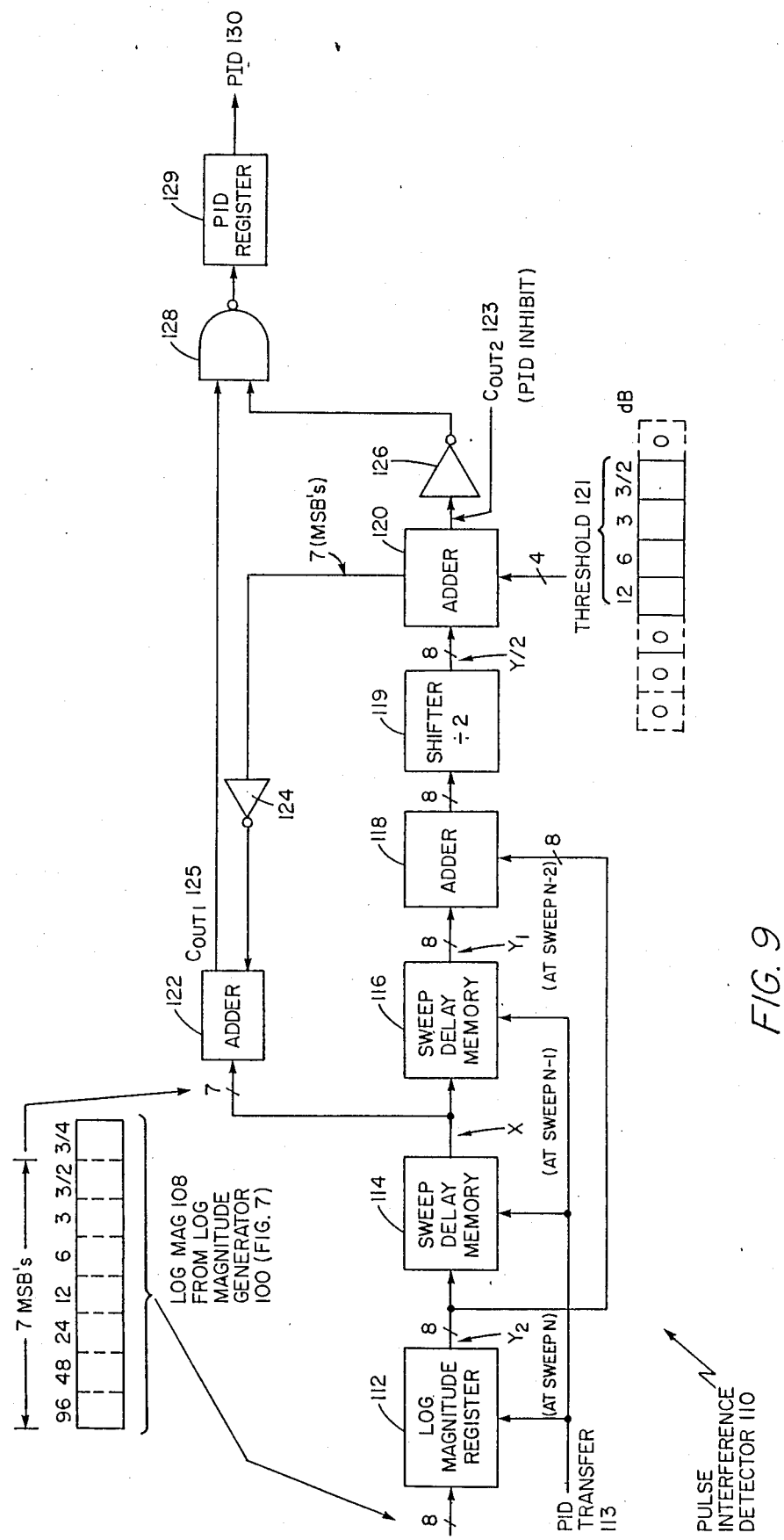
FIG. 9 is a functional block diagram of the pulse interference detector shown in FIG. 6.

Referring now to FIGS. 8 and 9 a block diagram of the pulse interference detector 110 is shown in FIG. 9. The eight-bit log mag 108 generated by the log magnitude generator 100 is coupled to the pulse interference detector 110 and temporarily stored in log magnitude register 112. The log mag 108 is then transferred to a first sweep delay memory 114 whose output is coupled to a second sweep delay memory 116. The log magnitude register 112, the sweep delay memory 114 and 116 provide temporary storage for the log magnitude values $Y_2$, X and $Y_1$ of the range samples at a Range M for radar sweeps N, N-1 and N-2 respectively and temporary storage occurs by means of PID transfer signal 113. The 8-bit output of log magnitude register 112 is also coupled to one input of adder 118 which receives another 8-bit input from the output of the second sweep delay memory 116. The output of adder 118 is coupled to a shifter 119 which effectively produces a division by two. The 8-bit output from shifter 119 is coupled to adder 120 where it is added to the threshold 121 level. If the output adder 120 overflows and therefore sets the carry-out bit, $C_{OUT2}$ 123, this bit will be inverted in inverter 126 and subsequently inhibits any detection of a pulse of interference via NAND gate 128. This inhibit function is provided because the log magnitudes and thresholds that are possible should never cause this bit $C_{OUT2}$ 123 to be set; thus, if it is set, it indicates a failure in the circuitry.

The 7 MSB's of the output of adder 120 are inverted in inverter 124 and added in adder 122 to the 7 MSB's of the output of sweep delay memory 114, which contains the range sample in sweep N-1 under investigation. The 7 MSB's are used to reduce quantization problems due to rounding or truncation of the log mag 108. In the preferred embodiment, the threshold 121 quantization is in 1.5 dB steps. When a pulse of interference has occurred, the addition performed by adder 122 produces a carry-out signal $C_{OUT1}$ 125 which after being gated through NAND gate 128 and registered in PID register 129 produces the signal PID 130 which indicates the detection of a pulse of interference.

Referring to FIGS. 8 and 9, the purpose of the pulse interference detector 110 is to detect a pulse of interference based on the following log magnitude algorithm criteria:

If X−y/2≦T, then No pulse interference.

If X−y/2>T, then Pulse interference occurred.

where,
X=log magnitude of range sample M being processed in sweep N-1 for possible pulse interference;
Y=$Y_2$+$Y_1$=sum of the log magnitude of adjacent range samples in sweep N-2 and sweep N;
Y1=log magnitude of range sample from previous sweep N-2 at same range as X;
Y2=log magnitude of range sample from next sweep N at same range as X (Note: X is calculated and stored one sweep before it is investigated for a pulse of interference);
T=4-bit threshold 121 value is typically 12 dB alterable in 1.5 dB increments.

Still referring to FIG. 8 and FIG. 9 after the range samples $Y_2$, X and $Y_1$ from three sweeps N, N-1, and N-2 are stored in the log magnitude register 112, first sweep delay memory 114, and second sweep delay memory 116, respectively, Y2 and Y1 are added in adder 118 and the sum is shifted one bit right by shifter 119 effectively dividing the sum ($Y_2$+$Y_1$) by 2 to obtain the truncated average of the sum ($Y_2$+$Y_1$) or Y/2. This average is added to threshold 121 level by adder 120 and the seven MSBs of the sum output are inverted by inverter 124 forming a one's complement number thereby obtaining a value suitable for direct comparison with X. The one's complement output from inverter 124 is compared to X using the 7 MSBs of each number, thereby providing an efficient method of implementing the pulse interference algorithm, namely, performing the following subtraction and compare:

$$X-(Y/2+T)<0$$

The binary addition of the always positive number X and the always negative number from the inverter 124 yields a single bit which is the carry-out, $C_{OUT1}$ 125, of the most significant stage of adder 122 which indicates that a pulse of interference occurred in sweep N-1. This bit is gated in NAND gate 128 by the output of inverter 126 which inverts $C_{OUT2}$ 123 to insure that a log magnitude overflow error condition did not occur. If such an error condition did occur, then a pulse interference detection via the log magnitude algorithm is inhibited. Otherwise, the PID 130 signal is stored temporarily in a PID register 129 prior to being transferred to the floating point interpolator 150.

Figure 10:
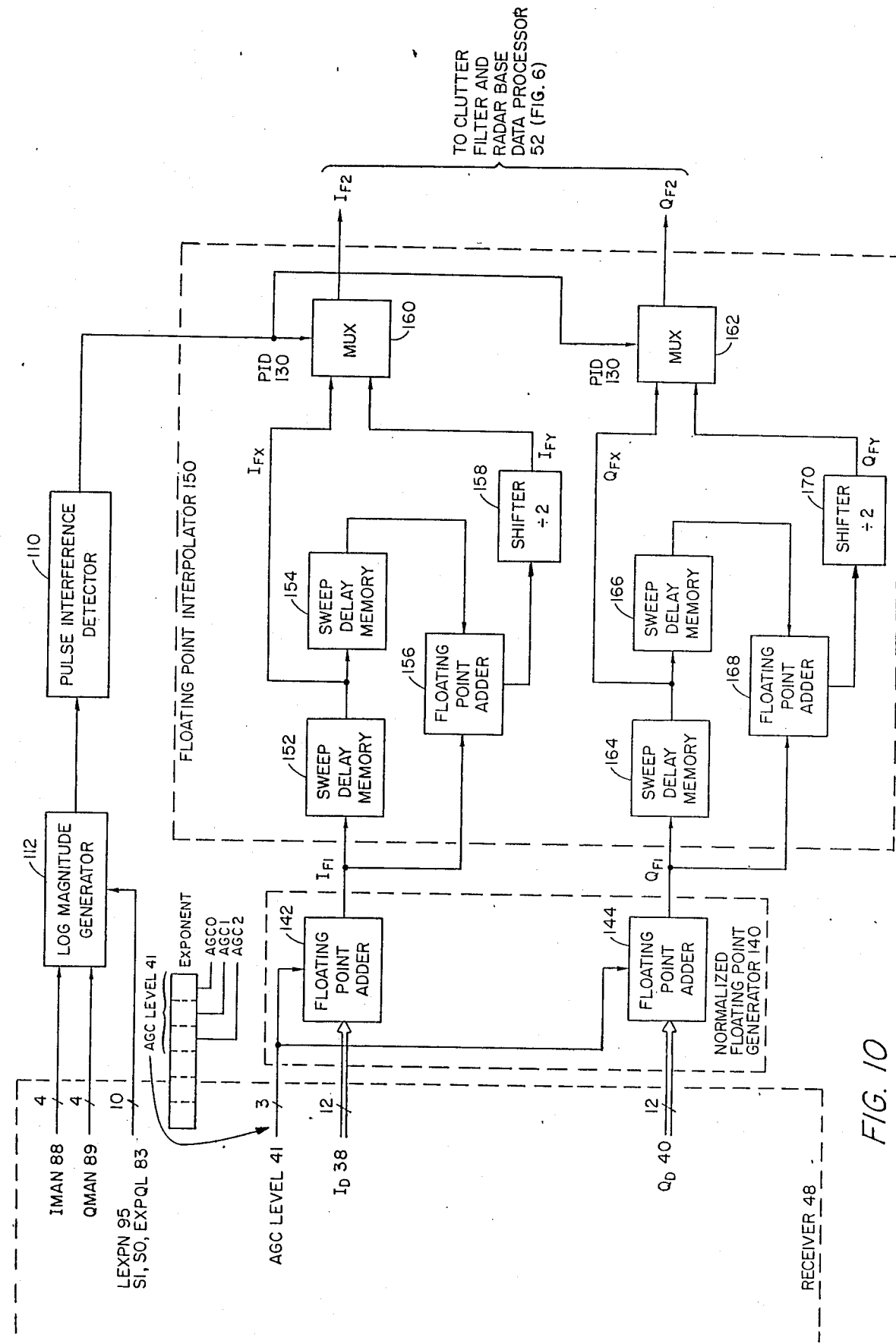
FIG. 10 is a functional block diagram showing a normalized floating point generator coupled to a floating point interpolator having an output selected by a pulse interference detector.

Referring now to FIG. 10 a functional block diagram of the floating point interpolator 150 is shown which receives the $I_{F1}$ and $Q_{F1}$ two's complement normalized floating point data inputs from the normalized floating point generator 140 comprising floating point adders 142 and 144 and the PID 130 signal from the pulse interference detector 110, and generates the $I_{F2}$ and $Q_{F2}$ two's complement normalized floating point digital words for coupling to the clutter filter and radar base data processor 51. The PID 130 signal connected to MUX 160 and MUX 162 selects the synthesized data $I_{FY}$ and $Q_{FY}$ for replacing the range sample of the interfered-with pulse. Otherwise, the $I_{FX}$ and $Q_{FX}$ range sample data is selected by MUX 160 and MUX 162 respectively, such data being the delayed equivalent of $I_{F1}$ and $OF_1$ outputs of the normalized floating point generator 140.

The floating point interpolator 150 creates synthesized range sample data for the interfered-with pulse by interpolating between non-interfered-with pulses in the adjacent sweeps. The sweep delay memor 152 stores the floating point value for the in-phase component of the range sample during sweep N−1 and the sweep delay memory 154 stores the floating point value for the in-phase component of the range sample during sweep N−2. When $I_{F1}$ occurs for sweep N, interpolation is performed by floating point adder 156 where range samples from sweeps N−2 and sweep N are added together and the sum is coupled to shifter 158 which effectively divides the sum by 2 forming the floating point interpolated value, $I_{FY}$, which is coupled to MUX 160. The interpolation of the floating point quadrature component is similarly performed. Sweep delay memory 164 stores the floating point value for the quadrature component of the range sample during sweep N−1 and the sweep delay memory 166 stores the floating point value for the quadrature component of the range sample during sweep N−2. When $Q_{FI}$ occurs for sweep N, interpolation is performed by floating point adder 168 where range samples from sweep N−2 and sweep N are added together and the sum is coupled to shifter 170 which effectively divides the sum by 2 forming the floating point interpolated value, $Q_{FY}$, which is coupled to MUX 162.

The outputs of multiplexers 160 and 162 are selected by the PID signal 130 generated from the pulse interference detector 110. If a pulse of interference does not occur, the samples $I_{FX}$ and $Q_{FX}$ pass through the multiplexers unaltered. If, however, a pulse of interference did occur, the interpolated values, $I_{FY}$ and $Q_{FY}$ pass through the multiplexers. This provides an efficient means for detecting, rejecting and replacing a range cell sample having a pulse of interference in real time.

This concludes the description of the preferred embodiment. However, many modifications and alterations will be obvious to one of ordinary skill in the art without departing from the spirit and scope of the inventive concept. Therefore, it is intended that the scope of this invention be limited only by the appended claims.

What is claimed is:

1. A receiver having a variable dynamic range for processing input signals from a plurality of transmission sweeps each of said sweeps having a plurality of range cells comprising:
   means for converting analog video signal representations of said input signals to digital words;
   means for adjusting a dynamic range of said receiver to correspond to a range of possible amplitudes of said input signals in response to an incremental automatic gain control (AGC) level;
   means coupled between said adjusting means and said converting means for generating said video signal representations for said plurality of range cells in each of said sweeps, each of said video signal representations having a real component; and
   means coupled to said converting means for generating said incremental AGC level for each one of said range cells in a next one of said sweeps, said incremental AGC level determined by an absolute value of (one of) said real component of said digital words of said video signal representations, an A/D limit condition set by said absolute value, an AGC level for a corresponding one of said range cells in a present one of said sweeps, an A/D limit condition for a corresponding range cell in a previous sweep and an A/D level guardband.

2. The receiver as recited in claim 1 wherein:
   said A/D level guardband comprises a 6 dB guardband for high pulse repetition frequency waveforms; and
   said A/D level guardband comprises a 12 dB guardband for low pulse repetition frequency waveforms.

3. A radar receiver having a variable dynamic range for processing radar return signals from a plurality of radar sweeps each of said sweeps having a plurality of range cells comprising:
   means for converting analog video signal representations of said radar return signals to digital words;
   means for adjusting a dynamic range of said receiver to correspond to a range of possible amplitudes of said input signals in response to an incremental automatic gain control (AGC) level;
   means coupled between said adjusting means and said converting means for generating said video signal representations for said plurality of range cells in each of said radar sweeps, each of said video signal representations having an in-phase (I) component and a quadrature (Q) component; and
   means coupled to said converting means for generating said incremental AGC level for each one of said range cells in a next one of said radar sweeps, said AGC level determined by a larger absolute value of either said I component or said Q component of said video signal representations, an A/D limit condition set by said absolute value, an AGC level for a corresponding one of said range cells in a present one of said radar sweeps, an A/D limit condition for a corresponding range cell in a previous sweep and an A/D level guardband.

4. The radar receiver as recited in claim 3 wherein:
   said converting means comprises a first analog to digital (A/D) converter for converting said in-phase (I) component to an $I_D$ digital word and a second A/D converter for converting said quadrature (Q) component to a $Q_D$ digital word.

5. The radar receiver as recited in claim 4 wherein:
   said $I_D$ digital word and said $Q_D$ digital word are generated in a two's complement number system.

6. The radar receiver as recited in claim 3 wherein:
   said incremental AGC level generating means includes means for varying said adjusting means in 6 dB increments.

7. The radar receiver as recited in claim 3 wherein:
   said A/D level guardband comprises a 6 dB guardband for high pulse repetition frequency waveforms; and
   said A/D level guardband comprises a 12 dB guardband for low pulse repetition frequency waveforms.

8. A radar system having automatic gain control (AGC) for adjusting the dynamic range of a receiver in said system to correspond to a range of possible amplitudes of radar return signals comprising:
   a first and second analog to digital (A/D) converters for converting analog video signal representations of said radar return signals for each of said range cells to digital words;
   an AGC attenuator for adjusting said dynamic range of said receiver to correspond to a range of possible amplitudes of said radar return signals in response to a first incremental AGC level;

phase demodulator means coupled between said AGC attenuator and said A/D converters for generating said video signal representations for each one of a plurality of range cells in each one of a plurality of radar sweeps, each of said video signal representations having an in-phase (I) component and a quadrature (Q) component;

An AGC generator coupled to said A/D converters for generating said first incremental AGC level for each one of said range cells in a next one of said radar sweeps, said first AGC level determined by a larger absolute value of either said I component or said Q component of said video signal representation, an A/D limit condition set by said absolute value, a second incremental AGC level for a corresponding one of said range cells in a present one of said radar sweeps, an A/D limit condition for a corresponding range cell in a previous sweep and an A/D level guardband.

a digital signal processor coupled to said AGC generator for processing said digital words for said I component and Q component of said video signal representations in normalized floating point notation, each I component and each Q component being a mantissa having an exponent equal to said second incremental AGC level.

9. The radar system as recited in claim 8 wherein: said first A/D converter comprises means for converting said in-phase (I) component to an $I_D$ digital word and said second A/D converter comprises means for converting said quadrature (Q) component to a $Q_D$ digital word.

10. The radar system as recited in claim 9 wherein: said $I_D$ digital word and said $Q_D$ digital word are generated in a two's complement number system by said converters.

11. The radar system as recited in claim 9 wherein: said $I_D$ digital word and said $Q_D$ digital word each form a mantissa portion of a floating point word in said floating point notation and each has a corresponding floating point exponent equal to said first AGC value for producing said $I_D$ digital word and said $Q_D$ digital word.

12. The radar receiver as recited in claim 8 wherein: said first incremental AGC level generating means includes means for varying said adjusting means in 6 dB increments.

13. The radar system as recited in claim 8 wherein: said guardband comprises a 6 dB guardband for high pulse repetition frequency waveforms; and said guardband comprises a 12 dB guardband for low pulse repetition frequency waveforms.

14. An incremental automatic gain control (AGC) apparatus in a radar receiver operating on radar return signals which may vary within a wide range of possible amplitudes from a plurality of radar sweeps each of said sweeps having a plurality of range cells comprising:
means for adjusting a dynamic range of said receiver to correspond to said range of possible amplitudes of said radar return signals in response to a next sweep AGC level;
detector means coupled to in-phase and quadrature components of said radar return signals for determining said next sweep AGC level for each of said range cells in said next sweep based on an AGC level for a corresponding one of said range cells in a present one of said sweeps, a present sweep A/D limit condition and a previous sweep A/D limit condition;
memory means coupled to said detector means for storing each of said next sweep AGC level and said present sweep A/D limit condition;
register means coupled to said memory means for setting initial conditions and temporarily storing output data from said memory means, said output data comprising said present sweep AGC level and said previous sweep A/D limit condition; and
delay means coupled to said register means for delaying said output data from said register means to enable said output data comprising a present sweep AGC level to become coincident in time with said in-phase and quadrature components derived from said return signals attenuated by said present sweep AGC level.

15. The incremental automatic gain control (AGC) apparatus as recited in claim 14 wherein said detector means comprises:
normalized floating point converter means for generating a mantissa and an exponent for each of said in-phase and quadrature components;
largest exponent selector means coupled to said converter means for selecting a largest exponent of said in-phase and quadrature components and detecting said present sweep A/D limit condition; and
next AGC level generator means coupled to said largest exponent selector means for generating said next sweep AGC level determined by a selected A/D level guardband, said largest exponent, said present sweep AGC level, said present sweep A/D limit and said previous sweep A/D limit for corresponding range cells.

16. The AGC apparatus as recited in claim 15 wherein:
said selected A/D level guardband comprises a 6 dB guardband for high pulse repetition frequency waveforms and a 12 dB guardband for low pulse repetition frequency waveforms.

17. The AGC apparatus as recited in claim 16 wherein said detector means further comprises:
means for incrementing said present sweep AGC level by one for said 6 dB guardband and by one or two for said 12 dB guardband based on an A/D level within said 12 dB guardband; and
means for incrementing said present sweep AGC level by one for said 6 dB guardband and by one or two for said 12 dB guardband based on an A/D level within said 12 dB guardband when limiting is detected in said present sweep and limiting was not detected in said previous sweep adjacent to said present sweep when generating said next sweep AGC level.

18. The AGC apparatus as recited in claim 16 wherein said detector means further comprises:
means for incrementing said present sweep AGC level by two for said 6 dB guardband and by three for said 12 dB guardband when limiting is detected in an adjacent previous sweep to said present sweep when generating said next sweep AGC level.

19. The AGC apparatus as recited in claim 16 wherein:

said present sweep AGC level is decremented by one for said 6 dB guardband in the larger exponent range 0-10 and decremented by 1 for said 12 dB guardband in the larger exponent range 0-9 when said radar return signals decrease in amplitude by 12 dB in said 6 dB guardband and decrease in amplitude by 18 dB in said 12 dB guardband to generate said next sweep AGC level.

20. The incremental automatic gain control (AGC) apparatus as recited in claim 15 wherein:
said normalized floating point converter means comprises means for converting a negative number to an absolute value, a floating point exponent of said absolute value being set to a unique code if A/D overflow detection occurs, said code setting an A/D limit and setting said exponent to a predetermined value.

21. The method of providing a variable dynamic range in a receiver for processing input signals having a range of possible amplitudes from a plurality of transmission sweeps each of said sweeps having a plurality of range cells comprising the steps of:
generating analog video signal representations of said input signals for said plurality of range cells in each of said sweeps, each of said video signal representations having a real component;
converting said analog video signal representations of said input signals to digital words;
adjusting said variable dynamic range of said receiver to correspond to said range of possible amplitudes of said input signals in response to an incremental automatic gain control (AGC) level; and
generating said incremental AGC level for each one of said range cells in a next one of said sweeps, said incremental AGC level determined by an absolute value of said real component of said digital words of said video signal representations, an A/D limit condition set by said absolute value, an AGC level for a corresponding one of said range cells in a present one of said sweeps, an A/D limit condition for a corresponding range cell in a previous sweep, and an A/D level guardband.

22. The method as recited in claim 21 wherein:
said step of adjusting said variable dynamic range comprises performing said adjusting in 6 dB incremental levels.

23. The method as recited in claim 21 wherein:
said step of generating said incremented AGC level further comprises the step of setting a guardband, said guardband being 6 dB for high pulse repetition frequency waveforms and 12 dB for low pulse repetition frequency waveforms.

24. The method of performing incremental automatic gain control (AGC) in a radar receiver operating on radar return signals from a plurality of radar sweeps each of said sweeps having a plurality of range cells comprising the steps of:
adjusting a dynamic range of said receiver to correspond to a range of possible amplitudes of said radar return signals in response to a next sweep AGC level;
determining from an in-phase and quadrature components of said radar return signals said next AGC level for each of said range cells in said next sweep based on an AGC level for a corresponding one of said range cells in a present one of said sweeps, a present sweep A/D limit condition and a previous sweep A/D limit condition;
storing in a memory means each of said next sweep AGC level and said present sweep A/D limit condition;
temporarily storing output data from said memory means in a register means, said output data comprising said present sweep AGC level and said previous sweep A/D limit condition; and
delaying output data from said register means to enable said register means output data comprising said present sweep AGC level to become coincident in time with said in-phase and quadrature components derived from said return signal attenuated by said present sweep AGC level.

25. The method as recited in claim 24 wherein said step of determining a next sweep AGC level for each of said range cells in said next sweep comprises:
generating a mantissa and an exponent for each of said in-phase and quadrature components;
selecting a largest exponent of said in-phase and quadrature components; and
generating said next sweep AGC level as determined by a selected A/D level guardband, said largest exponent, said present sweep AGC level, said present sweep A/D limit and said previous sweep A/D limit for corresponding range cells.

26. The method as recited in claim 24 wherein:
said step of adjusting said dynamic range in response to a next sweep AGC level further comprises the steps of incrementing said present sweep AGC level by one for said 6 dB guardband and by one or two based on an A/D level within said 12 dB guardband; and
incrementing said present sweep AGC level by one for said 6 dB guardband and by one or two based on an A/D level within said 12 dB guardband when limiting is detected in said present sweep and limiting was not detected in said previous sweep adjacent to said present sweep to generate said next sweep AGC level.

27. The method as recited in claim 24 wherein:
said step of adjusting said dynamic range in response to a next sweep AGC level comprises the step of incrementing said present sweep AGC level by two for said 6 dB guardband and by three for said 12 dB guardband when limiting is detected in an adjacent previous sweep to said present sweep to generate said next sweep AGC level.

28. The method as recited in claim 24 wherein:
said step of adjusting said dynamic range in respons to a next sweep AGC level comprises the step of decrementing said present sweep AGC level by one for said 6 dB guard-band in the larger exponent range 0-10 and by one for said 12 dB guardband in the larger exponent range 0-9 when said radar return signals decrease in amplitude by 12 dB in said 6 dB guardband and by 18 dB in said 12 dB guardband

* * * * *